US006967633B1

(12) United States Patent
Tanaka

(10) Patent No.: US 6,967,633 B1
(45) Date of Patent: Nov. 22, 2005

(54) DISPLAY DEVICE

(75) Inventor: Yukio Tanaka, Kanagawa (JP)

(73) Assignee: Semiconductor Energy Laboratory Co., Ltd., (JP)

( * ) Notice: Subject to any disclaimer, the term of this patent is extended or adjusted under 35 U.S.C. 154(b) by 85 days.

(21) Appl. No.: 09/684,568

(22) Filed: Oct. 6, 2000

(30) Foreign Application Priority Data

Oct. 8, 1999 (JP) ................................ 11-287583

(51) Int. Cl.[7] ........................ G09G 5/00; G03F 1/1343

(52) U.S. Cl. .......................... 345/3.3; 349/46; 349/48; 257/408

(58) Field of Search ........................... 345/659, 98, 99, 345/100, 3.2–3.4; 349/42–48; 257/408

(56) References Cited

U.S. PATENT DOCUMENTS

| | | | | |
|---|---|---|---|---|
| 5,189,404 | A * | 2/1993 | Masino et al. | 345/659 |
| 5,287,205 | A * | 2/1994 | Yamazaki et al. | 349/174 |
| 5,323,042 | A | 6/1994 | Matsumoto | 257/350 |
| 5,335,022 | A * | 8/1994 | Braun et al. | 348/744 |
| 5,594,569 | A | 1/1997 | Konuma et al. | 349/122 |
| 5,643,826 | A | 7/1997 | Ohtani et al. | 437/88 |
| 5,654,733 | A * | 8/1997 | Chimura et al. | 345/96 |
| 5,693,959 | A | 12/1997 | Inoue et al. | 257/66 |
| 5,767,930 | A * | 6/1998 | Kobayashi et al. | 349/42 |
| 5,790,092 | A * | 8/1998 | Moriyama | 345/96 |
| 5,860,720 | A * | 1/1999 | Negishi et al. | 353/74 |
| 5,923,962 | A | 7/1999 | Ohtani et al. | 438/150 |
| 5,940,151 | A * | 8/1999 | Ha | 349/43 |
| 5,949,408 | A * | 9/1999 | Kang et al. | 345/169 |
| 6,180,957 | B1 | 1/2001 | Miyasaka et al. | 257/57 |
| 6,232,932 | B1 * | 5/2001 | Thorner | 345/1.3 |
| 6,259,138 | B1 | 7/2001 | Ohtani et al. | 257/351 |
| 6,292,183 | B1 * | 9/2001 | Yamazaki et al. | 345/211 |
| 6,339,411 | B2 * | 1/2002 | Miyazaki et al. | 345/1.1 |
| 6,365,917 | B1 | 4/2002 | Yamazaki | 257/72 |
| 6,420,758 | B1 | 7/2002 | Nakajima | 257/350 |
| 6,469,317 | B1 | 10/2002 | Yamazaki et al. | 257/59 |
| 6,501,098 | B2 | 12/2002 | Yamazaki | 257/72 |
| 6,512,271 | B1 | 1/2003 | Yamazaki et al. | 257/350 |

(Continued)

FOREIGN PATENT DOCUMENTS

EP 1 001 467 A2 5/2000

(Continued)

OTHER PUBLICATIONS

English Abstract re Japanese Patent Application No. JP 7-130652, published May 19, 1995.

(Continued)

*Primary Examiner*—Dennis-Doon Chow
*Assistant Examiner*—Leland R. Jorgensen
(74) *Attorney, Agent, or Firm*—Cook, Alex, McFarron, Manzo, Cummings & Mehler, Ltd.

(57) ABSTRACT

To provide a liquid crystal panel employing a circuit layout that makes it possible to obtain a small size liquid crystal panel when the area a source driver occupies is large. A liquid crystal display device of the present invention comprises: a pixel portion including m×n pixels (m and n are both natural numbers and satisfy the relation m<n), the pixels each having a TFT; a gate driver for feeding n gate signal lines with selection signals; a source driver for feeding m source signal lines with video data; and a video data converter circuit, and is characterized in that the video data converter circuit converts first video data (h, k) (h=1~m, k=1~n) into second video data, and in that the video data (h, k) constituting the first video data is converted into {m(k−1)+h}-th video data that constitutes the second video data.

49 Claims, 16 Drawing Sheets

U.S. PATENT DOCUMENTS

| | | | | |
|---|---|---|---|---|
| 6,518,594 | B1 | 2/2003 | Nakajima et al. | 257/59 |
| 6,524,895 | B2 | 2/2003 | Yamazaki et al. | 438/149 |
| 6,531,713 | B1 | 3/2003 | Yamazaki | 257/59 |
| 6,542,137 | B2 * | 4/2003 | Kimura et al. | 345/76 |
| 6,576,924 | B1 | 6/2003 | Yamazaki et al. | 257/59 |
| 6,576,926 | B1 | 6/2003 | Yamazaki et al. | 257/66 |
| 6,674,136 | B1 * | 1/2004 | Ohtani | 257/408 |

FOREIGN PATENT DOCUMENTS

| | | |
|---|---|---|
| EP | 1 005 093 A2 | 5/2000 |
| EP | 1 005 094 A2 | 5/2000 |
| EP | 1 028 469 A2 | 8/2000 |
| EP | 1 031 873 A2 | 8/2000 |
| EP | 1 033 755 A2 | 9/2000 |
| EP | 1 041 641 A2 | 10/2000 |
| JP | 3-250632 | 11/1991 |
| JP | 4-369271 | 12/1992 |
| JP | 5-102483 | 4/1993 |
| JP | 10-144929 | 5/1998 |

OTHER PUBLICATIONS

H. Furue et al., "Characteristics and Driving Scheme of Polymer—Stabilized Monostable FLCD Exhibiting Fast Response Time and High Contrast Ratio with Gray-Scale Capability," SID DIGEST, pp. 782-785 (1998).

T. Yoshida et al., "A Full-Color Thresholdless Antiferroelectric LCD Exhibiting Wide Viewing Angle with Fast Response Time," SID DIGEST, pp. 841-844 (May 13, 1997).

S. Inui et al., "Thresholdless antiferroeletricity in liquid crystals and its application to displays," J. Mater Chem, pp. 671-673 (1996).

Terada et al., "Half-V shape Switching Mode FLCD," Extended Abstracts of the 46$^{th}$ Convention of The Japan Society of Applied Physics, p. 1316 (Mar. 1999).

Yoshihara et al., "Time-division Full Color LCD Using Ferroeletric Liquid Crystal," Liquid Crystal vol. 3, No. 3, p. 190.

* cited by examiner 6001
6002
6003a

6003b 6004
6005
6006
6008
6007

6009
6010
6011
6012

6013
6014
6015
6016
6017
6018
6019

6020

6021
6022

6023
6024
6025
6026
6027
6028
6028a
6028b
6029
6029a
6029b
6030
6030a
6030b
6031
6031a
6031b
6032
6032a
6032b 6033
6034

6035
6036
6037
6038
6039
6040
6041
6042

6043
6044

6028c
6029c
6030c
6031c
6032c

DISPLAY DEVICE

BACKGROUND OF THE INVENTION

1. Field of the Invention

The present invention relates to a display device, specifically, to an active matrix display device.

2. Description of the Related Art

Rapid development has been made lately in a technique of manufacturing an electronic device such as a thin film transistor (TFT), for example, in which a thin film semiconductor is formed on an inexpensive glass substrate. This is due to an increasing demand for an active matrix liquid crystal panel.

The active matrix liquid crystal panel has a pixel portion in which several hundred thousands to several million TFTs are arranged in a matrix-like manner, and displays an image by controlling electric charges flowing in and out of pixel electrodes connected to each of the TFTs by means of a switching function of the TFTs.

Conventionally, thin film transistors arranged in the pixel portion are fabricated using amorphous silicon that is formed on a glass substrate.

However, in recent years, it has been found that a thin film transistor could be formed from a polycrystalline silicon film while using quartz as a substrate. In this case, peripheral driver circuits are integrated with the pixel portion so that both the circuits and the pixel portion are formed on the quartz substrate.

A technique is also known in which a thin film transistor is fabricated from a crystalline silicon film formed on a glass substrate by using laser annealing or other technologies.

However in addition to large active matrix liquid crystal panels used as display devices in personal computers, smaller ones used in front projectors, rear projectors, and Head Mounted Displays (HMD) have recently emerged. Smaller is better since smaller active matrix liquid crystal panels can be used for increasingly smaller electronic devices. Recently, a panel the size of about 0.7 inches, diagonally, is being mass produced.

Referring to FIG. 17, the structure of a conventional active matrix liquid crystal panel is shown schematically. In FIG. 17, reference numeral 11000 denotes a liquid crystal panel, 11100, a source driver, 11200, a gate driver, 11300, a pixel portion, and 11400, an FPC terminal. The FPC terminal is a terminal for inputting video data, a clock signal, a power supply, etc. to the liquid crystal panel. When the lateral length of the pixel portion is given as W and the longitudinal length thereof as H, W/H is generally 4/3 or 16/9.

Due to the recent demand for miniaturization, however, it is no longer possible to construct such smaller display devices in accordance with the circuit layout shown in FIG. 17. For instance, in some liquid crystal panels, the size of the substrate has to be reduced in the longitudinal direction of the gate driver. When this occurs, there is no longer enough area for the source driver to occupy. In other words, the number of elements constituting the source driver is greater as compared with the gate driver, and accordingly the source driver occupies a larger area. The conventional circuit layout can not deal with miniaturization because the source driver occupies too large of an area.

SUMMARY OF THE INVENTION

The present invention has been made in view of the above problem, and an object of the present invention is therefore to meet the demand for downsizing liquid crystal panels.

In a liquid crystal display device of the present invention, if the longitudinal length of a pixel portion is given as W, the lateral length thereof as L, and the number of pixels in the pixel portion as m (length)×n (width), L>W and m<n are both satisfied, and a gate driver is placed above the pixel portion whereas a source driver is set on one side of the pixel portion. Video data inputted from the external are rearranged and then inputted to the source driver.

The structure of the present invention will be described below.

According to the present invention, there is provided a liquid crystal display device comprising:

- a pixel portion including m×n pixels (m and n are both natural numbers and satisfy the relation m<n), the pixels each having a TFT;
- a gate driver for feeding n gate signal lines with selection signals;
- a source driver for feeding m source signal lines with video data; and
- a video data converter circuit, characterized in that
- the video data converter circuit converts first video data (h, k) (h=1~m, k=1~n) into second video data, and in that
- the video data (h, k) constituting the first video data is converted into {m(k−1)+h}-th video data that constitutes the second video data.

According to the present invention, there is provided a liquid crystal display device comprising:

- a pixel portion including m×n pixels (in a pixel (h, k),h=1~m, k=1~n, with m and n both being natural numbers and satisfying the relation m<n), said pixels each having a TFT;
- a gate driver for feeding n gate signal lines with selection signals;
- a source driver for feeding m source signal lines with video data; and
- a video data converter circuit, characterized in that
- said video data converter circuit converts first video data (h, k) (h=1~m, k=1~n) which is to be fed to said pixel (h, k) into second video data, and in that the video data (h, k) constituting the first video data is converted into {m(k−1)+h}-th video data that constitutes the second video data.

DETAILED DESCRIPTION OF THE PREFERRED EMBODIMENTS

Figure 1:
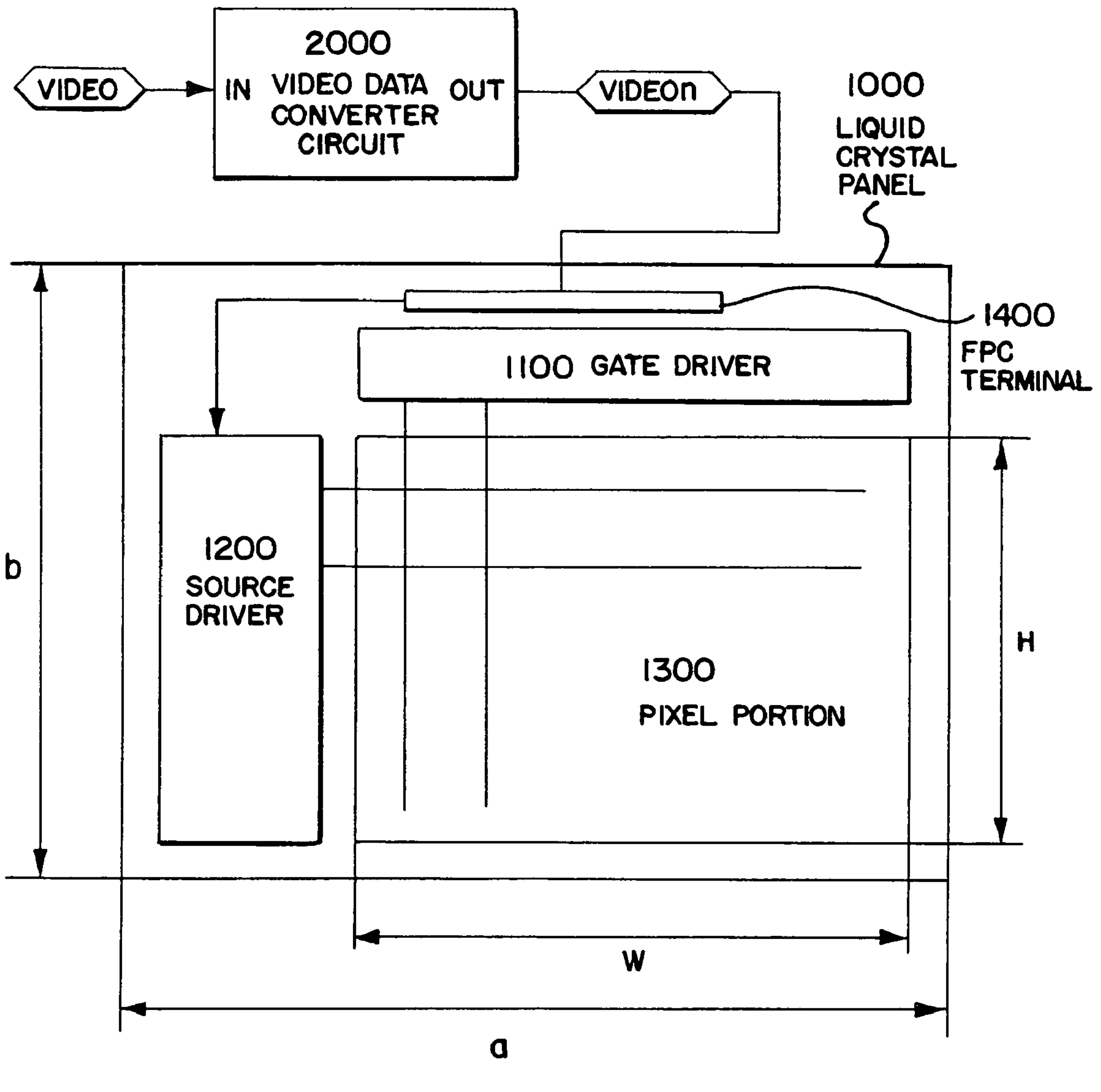
FIG. 1 is a schematic structural diagram showing a liquid crystal display device according to the present invention.

A liquid crystal display device according to an embodiment of the present invention is shown in FIG. 1.

The liquid crystal display device of this embodiment, shown in FIG. 1, has a liquid crystal panel 1000 and a video data converter circuit 2000. The liquid crystal panel 1000 includes a gate driver 1100, a source driver 1200, a pixel portion 1300, and an FPC terminal 1400. The video data converter circuit 2000 receives video data (VIDEO) inputted thereto. The inputted video data (VIDEO) is converted into video data n (VIDEOn) by the video data converter circuit 2000, and then the video data converter circuit 2000 outputs the video data n (VIDEOn) to the source driver 1200 of the liquid crystal panel 1000. The index "n" in the video data n stands for "new". Note that, although this embodiment describes a liquid crystal display device of the present invention taking as an example a liquid crystal panel with a pixel portion having 5 (width)×4 (length) pixels, the liquid crystal display device of the present invention is not limited thereto.

In the liquid crystal display panel of the liquid crystal display device according to the present invention, a>b with the lateral length of the liquid crystal panel 1000 (the length of the liquid crystal panel in the lengthwise direction of the gate driver) being a, and the longitudinal length of the liquid crystal panel 1000 (the length of the liquid crystal panel in the lengthwise direction of the source driver) being b. Also, if the lateral length of the pixel portion 1300 (the length of the pixel portion 1300 in the lengthwise direction of the gate driver) is given as W while the longitudinal length of the pixel portion 1300 (the length of the pixel portion 1300 in the lengthwise direction of the source driver) is given as H, the relation W>H should be satisfied.

Figure 2:
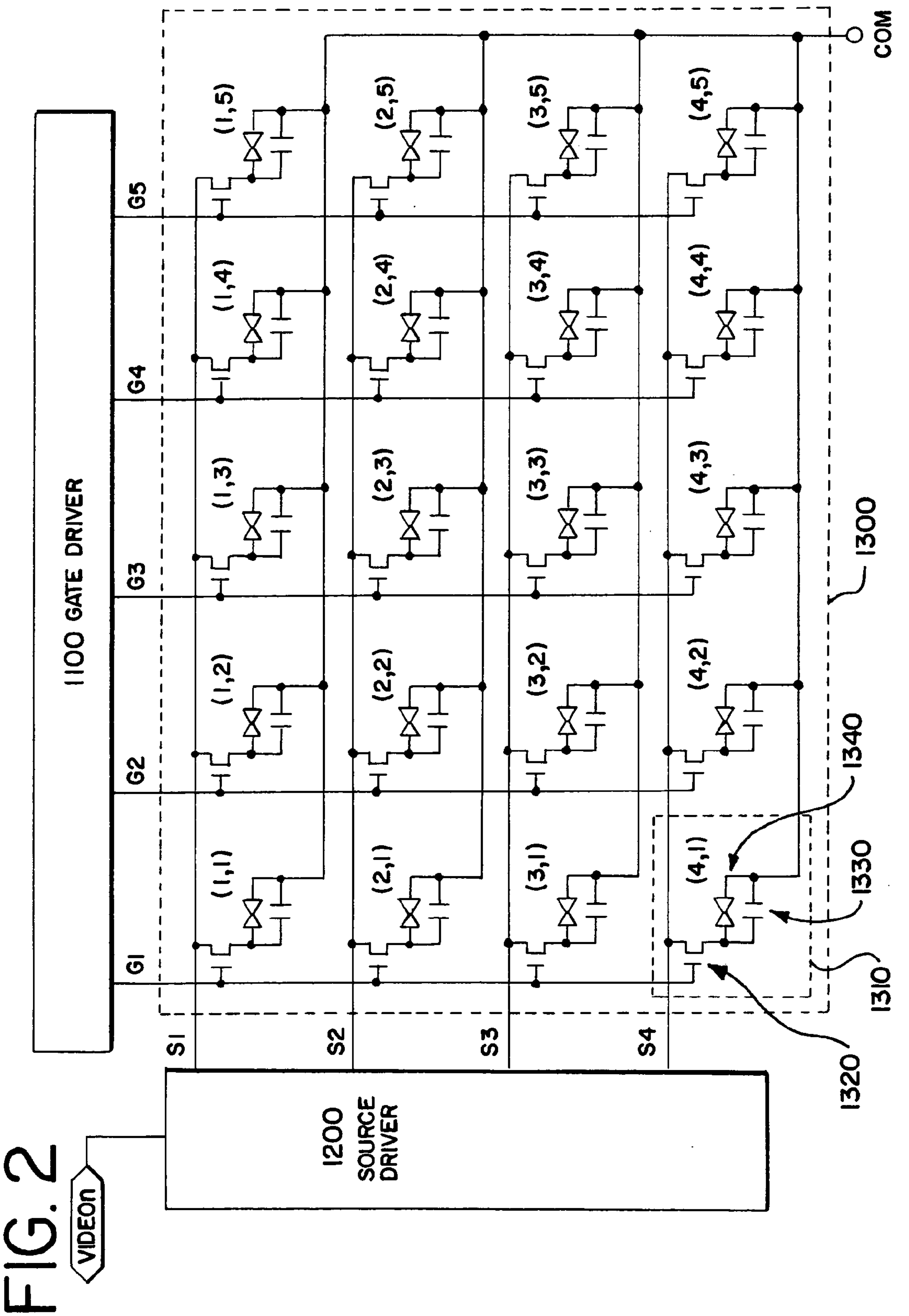
FIG. 2 is a circuit structural diagram showing a liquid crystal panel of the liquid crystal display device according to the present invention.

Referring now to FIG. 2, the outline of the circuit structure of the liquid crystal panel of the liquid crystal display device according to the present invention will be explained. FIG. 2 shows the circuit structure of the pixel portion 1300. The pixel portion 1300 is structured such that pixels 1310 are arranged in a matrix-like manner. Each of the pixels 1310 has a TFT 1320, a holding capacitor 1330, and a liquid crystal 1340. A pixel electrode (not shown) connected to either end of a source of the TFT or of a drain of the TFT and an opposite electrode (not shown) cooperate to apply voltage to the liquid crystal. The opposite electrode is connected to a common electric potential (COM). The holding capacitor 1330 may not exactly be as shown in FIG. 2. The pixels 1310 constituting the pixel portion 1300 are respectively denoted by symbols (1, 1), (1, 2), . . . and (4, 5). The respective pixels are from now on referred to by their symbols, as in "pixel (1, 1)".

The gate driver 1100 sequentially feeds selection signals to gate signal lines G1, G2, G3, G4, and G5. The gate signal line G1 is connected to a gate electrode of the TFT 1320 of each of the pixel (1, 1), the pixel (2, 1), the pixel (3, 1), and the pixel (4, 1). The gate signal line G2 is connected to a gate electrode of the TFT 1320 of each of the pixel (1, 2), the pixel (2, 2), the pixel (3, 2), and the pixel (4, 2). The gate signal line G3 is connected to a gate electrode of the TFT 1320 of each of the pixel (1, 3), the pixel (2, 3), the pixel (3, 3), and the pixel (4, 3). The gate signal line G4 is connected to a gate electrode of the TFT 1320 of each of the pixel (1, 4), the pixel (2, 4), the pixel (3, 4), and the pixel (4, 4). The gate signal line G5 is connected to a gate electrode of the TFT 1320 of each of the pixel (1, 5), the pixel (2, 5), the pixel (3, 5), and the pixel (4, 5).

Inputted to the source driver 1200 is the video data n (VIDEOn) created in the video data converter circuit 2000. The source driver 1200 feeds video data to source electrodes of the TFTs of the pixels through source signal lines S1, S2, S3, and S4, respectively. The source signal line S1 is connected to a source region of the TFT of each of the pixel (1, 1), the pixel (1, 2), the pixel (1, 3), the pixel (1, 4), and the pixel (1, 5). The source signal line S2 is connected to a source region of the TFT of each of the pixel (2, 1), the pixel (2, 2), the pixel (2, 3), the pixel (2, 4), and the pixel (2, 5). The source signal line S3 is connected to a source region of the TFT of each of the pixel (3, 1), the pixel (3, 2), the pixel (3, 3), the pixel (3, 4), and the pixel (3, 5). The source signal line S4 is connected to a source region of the TFT of each of the pixel (4, 1), the pixel (4, 2), the pixel (4, 3), the pixel (4, 4), and the pixel (4, 5).

Figure 3:
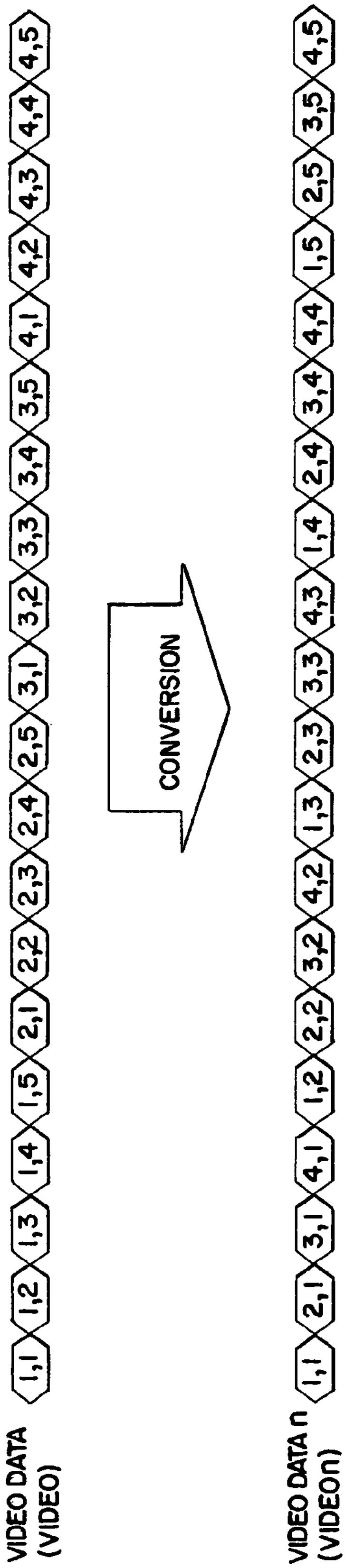
FIG. 3 is a chart illustrating the operation of converting video data (VIDEO) by a video data converter circuit according to the present invention.

The function of the video data converter circuit 2000 and the operation thereof will be described next. The video data converter circuit 2000 converts video data (VIDEO) into video data n (VIDEOn). Referring to FIG. 3, the drawing illustrates how the video data (VIDEO) is converted into the video data n (VIDEOn). Each video data in the video data (VIDEO) has its own symbol such as (1, 1), (1, 2), . . . and (4, 5). The respective video data are from now on referred to by their symbols, as in "video data (1, 1)".

The symbols allotted to the video data correspond to the symbols that designate the pixels. That is, the video data (1, 1) is fed to the pixel (1, 1)(to the source region of the TFT of the pixel (1, 1), to be exact), and the video data (1, 2) is fed to the pixel (1, 2).

The video data (VIDEO) before conversion consists of the video data (1, 1), the video data (1, 2), the video data (1, 3), . . . , the video data (4, 4), and the video data (4, 5) which are arranged in this order. In the liquid crystal panel 1000 of the liquid crystal display device according to the present invention, however, the pixel (1, 1) is the first to be fed with the video data, the pixel (2, 1) is the second, and then the pixel (3, 1), the pixel (4, 1), the pixel (1, 2), . . . , the pixel (3, 5), and the pixel (4, 5) is the last. Therefore, the video data cannot be inputted to proper pixels as long as they are in the form of video data (VIDEO) while being arranged in the before-conversion order.

The before-conversion video data (VIDEO) thus needs to be converted into video data n (VIDEOn) by the video data converter circuit 2000. The after-conversion video data n (VIDEOn) consists of the video data (1, 1), the video data (2, 1), the video data (3, 1), . . . , the video data (3, 5), and the video data (4, 5) which are arranged in this order. Now the respective video data can be inputted to proper pixels.

Figure 4:
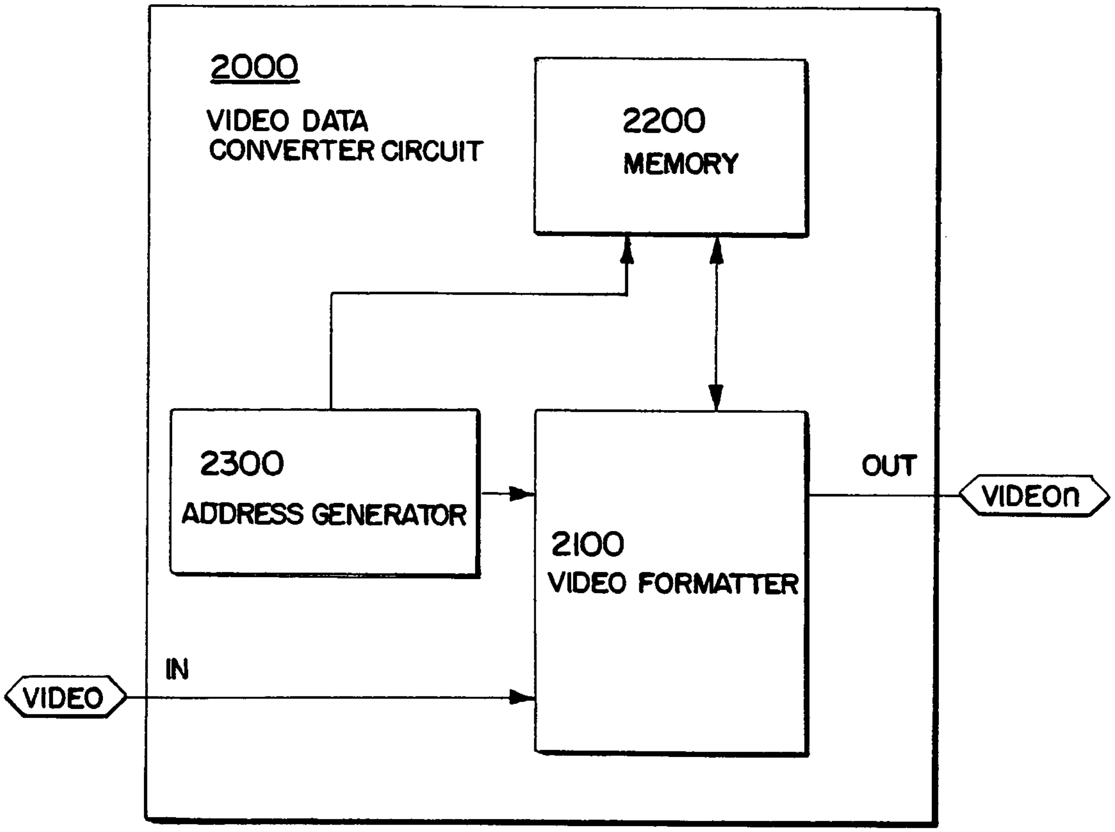
FIG. 4 is a diagram showing an example of the circuit structure of the video data converter circuit according to the present invention.

Described next is the circuit structure of the video data converter circuit 2000 according to this embodiment with the circuit structure schematically shown in FIG. 4. In this embodiment the video data converter circuit 2000 has a video formatter 2100, a memory 2200, and an address generator 2300. The video data (VIDEO) is inputted to the video formatter 2100 of the video converter circuit 2000, and the video data in the video data (VIDEO) are sequentially stored in the memory 2200. The address generator 2300 gives an address to each video data so that the video data stored in the memory 2200 are read out in the predetermined order, and the generator controls the transmission of video signals from the memory 2200 to the video formatter 2100. The video data n (VIDEOn) is then outputted from the video formatter 2100.

Both the video data (VIDEO) and the video data n (VIDEOn) are digital data in this embodiment. However, the present invention can handle inputting and outputting analog video data by employing a D/A converter circuit and an A/D converter circuit.

Figure 5:
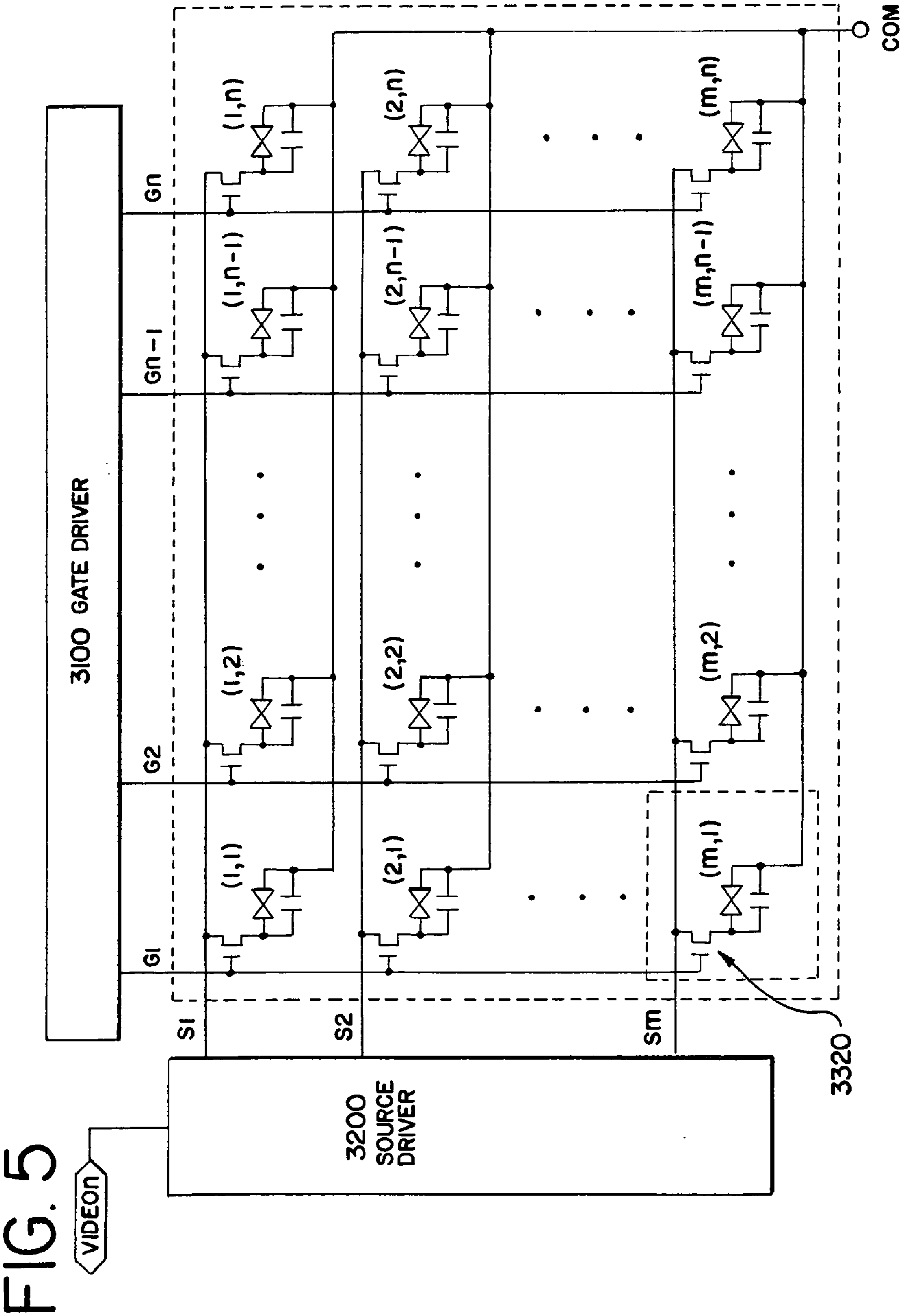
FIG. 5 is a circuit structural diagram showing a liquid crystal panel of a liquid crystal display device according to the present invention.

Reference is made to FIG. 5 where a liquid crystal panel of the liquid crystal display device according to the present invention is shown. This liquid crystal panel has a pixel portion including m (length)×n (width) pixels. The numerals expressed as m and n are both natural numbers. Each pixel has its own symbol and is referred to as pixel (h, k) (h=1~m, k=1~n).

A gate driver 3100 sequentially feeds selection signals to gate signal lines G1, G2, . . . , Gn−1, and Gn. The gate signal line G1 is connected to a gate electrode of a TFT 3320 of each of the pixel (1, 1), the pixel (2, 1), . . . , the pixel (m−1, 1) and the pixel (m, 1). The gate signal line G2 is connected to a gate electrode of the TFT 3320 of each of the pixel (1, 2), the pixel (2, 2), . . . , the pixel (m−1, 2) and the pixel (m, 2). In a similar manner, the gate signal line Gn is connected to a gate electrode of the TFT 3320 of each of the pixel (1, n), the pixel (2, n), . . . , the pixel (m−1, n) and the pixel (m, n).

Inputted to a source driver 3200 is video data n (VIDEOn) created in the video data converter circuit. The source driver 3200 feeds video data to source electrodes of the TFTs of the pixels through source signal lines S1, S2, . . . , Sm−1, and Sm, respectively. The source signal line S1 is connected to a source region of the TFT 3320 of each of the pixel (1, 1), the pixel (1, 2), . . . , the pixel (1, n−1), and the pixel (1, n). The source signal line S2 is connected to a source region of the TFT 3320 of each of the pixel (2, 1), the pixel (2, 2), . . . , the pixel (2, n−1), and the pixel (2, n). In a similar manner, the source signal line Sm is connected to a source region of the TFT 3320 of each of the pixel (m, 1), the pixel (m, 2), . . . , the pixel (m, n−1), and the pixel (m, n).

The description given next is about the making of the video data (VIDEOn) to be inputted to the liquid crystal panel of the present invention which is shown in FIG. 5.

Figure 6:
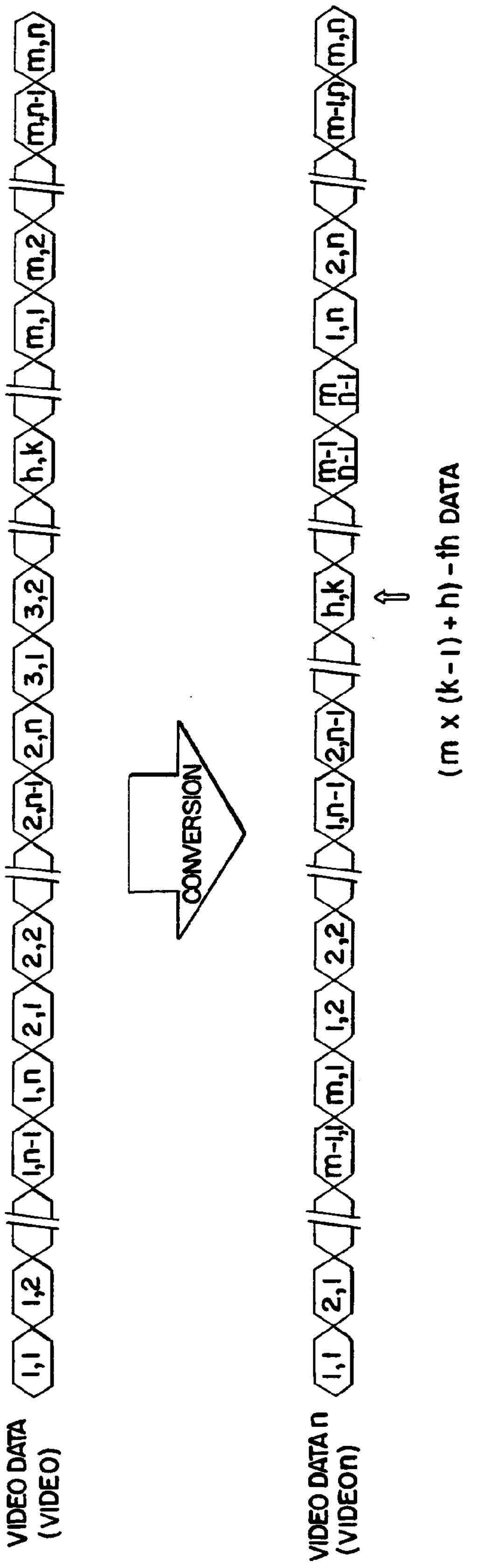
FIG. 6 is a chart illustrating the operation of converting video data (VIDEO) by a video data converter circuit according to the present invention.

Referring to FIG. 6, the video data (VIDEO) before inputted to the video converter circuit (before conversion) consists of the video data (1, 1), the video data (1, 2), . . . , the video data (1, n−1), the video data (1, n), the video data (2, 1), the video data (2, 2), . . . , the video data (m, 1), the video data (m, 2), . . . , the video data (m, n−1), and the video data (m, n), which are arranged in this order.

The before-conversion video data (VIDEO) is converted into video data n (VIDEOn) by the video data converter circuit. The after-conversion video data n (VIDEOn) consists of the video data (1, 1), the video data (2, 1), . . . , the video data (m−1, 1), the video data (m, 1), the video data (1, 2), . . . , the video data (m, n−1), the video data (1, n), the video data (2, n), . . . , the video data (m−1, n), and the video data (m, n) which are arranged in this order. The respective video data thus can be inputted to proper pixels.

Therefore, in the liquid crystal display panel of this embodiment, the video data (h, k) of the video data (VIDEO) corresponds to the $\{m(k-1)+h\}$-th data among the data that constitute the video data n (VIDEOn).

For example, the video data (1, 1) of the video data (VIDEO) corresponds to the first video data among the data that constitute the video data n (VIDEOn). The video data (2, 2) of the video data (VIDEO) corresponds to the (m+2)-th video data among the data that constitute the video data n (VIDEOn). The video data (m, n) of the video data (VIDEO) corresponds to the (m×n)-th video data among the data that constitute the video data n (VIDEOn).

By controlling the address generator of the video data converter circuit in this way, the video data are read out of the memory in the appropriate order and inputted to the liquid crystal panel. An image as desired can thus be obtained.

Figure 7:
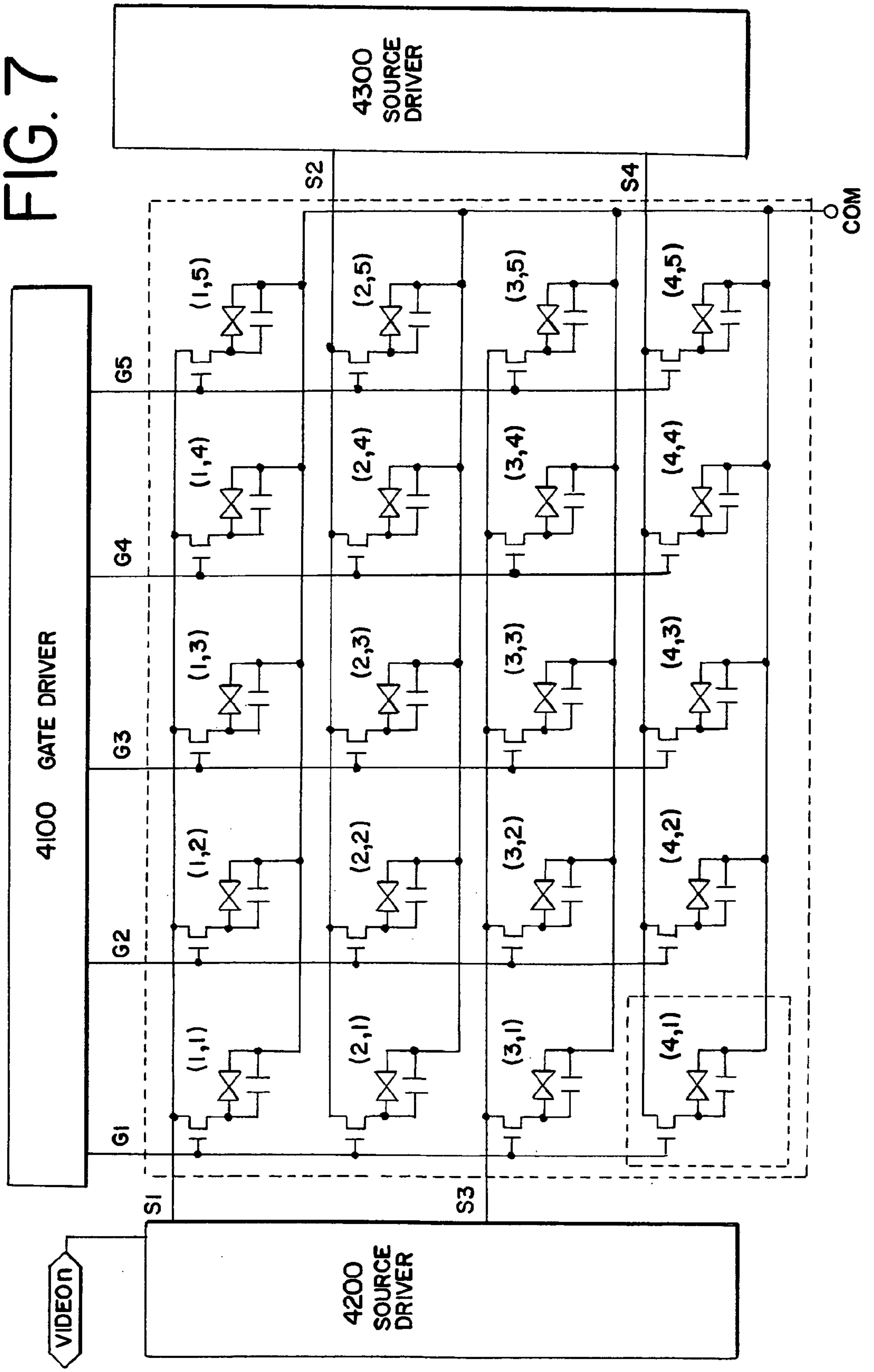
FIG. 7 is a circuit structural diagram showing a liquid crystal panel of a liquid crystal display device according to the present invention.

Referring next to FIG. 7, another liquid crystal panel embodiment according to this invention is shown. The liquid crystal panel in FIG. 7 has a source driver on each of its left side and right side.

A source driver 4200 feeds video data to the odd-numbered source signal lines S1 and S3, whereas a source driver 4300 feeds video data to the even-numbered signal lines S2 and S4.

This arrangement makes it possible to apply the present invention even if the circuit structure of the source driver is complicated and the area the source driver occupies is accordingly large.

In addition, left-right inversion of the display screen can readily be achieved by inverting the direction of the operation of the gate driver (the order to feed selection signals).

Figure 16:
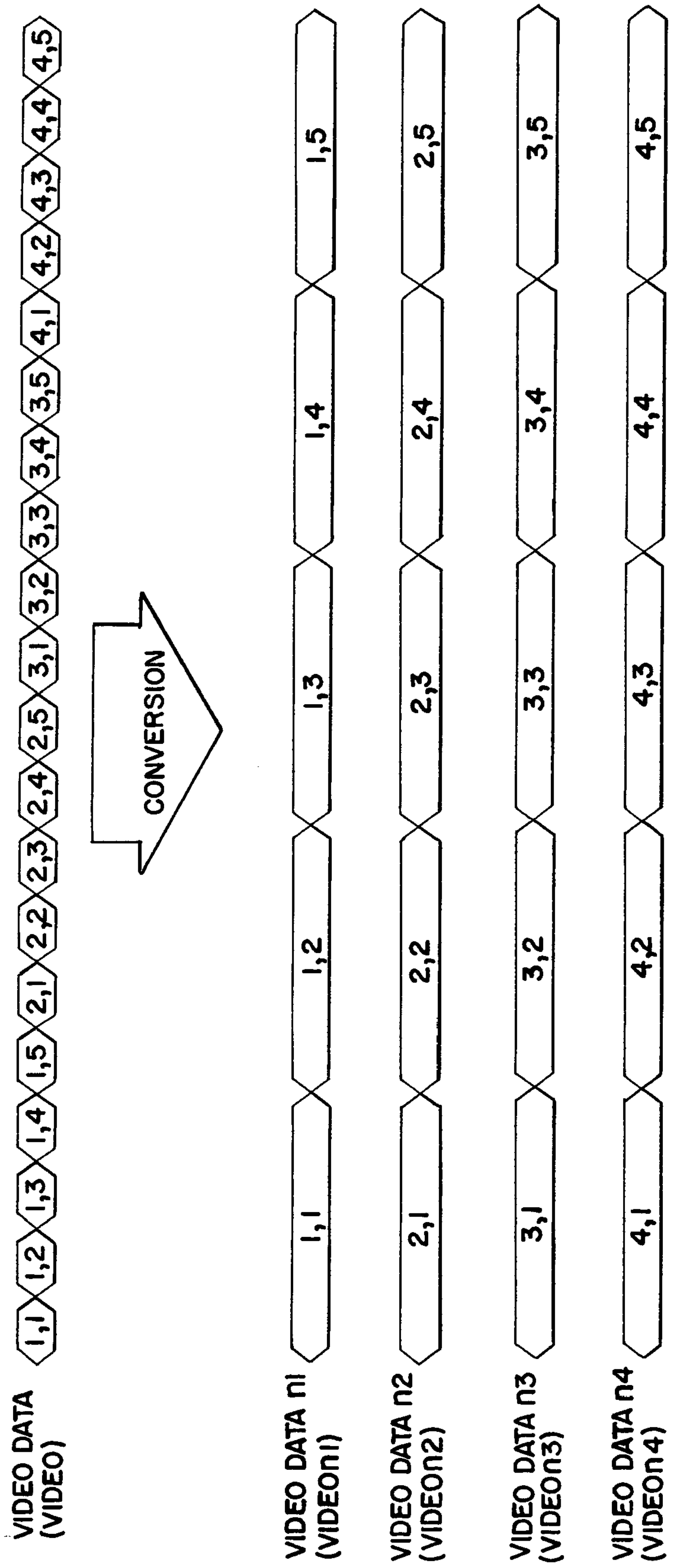
FIG. 16 is a chart illustrating the operation of converting video data (VIDEO) by a video data converter circuit according to the present invention.
Figure 17:
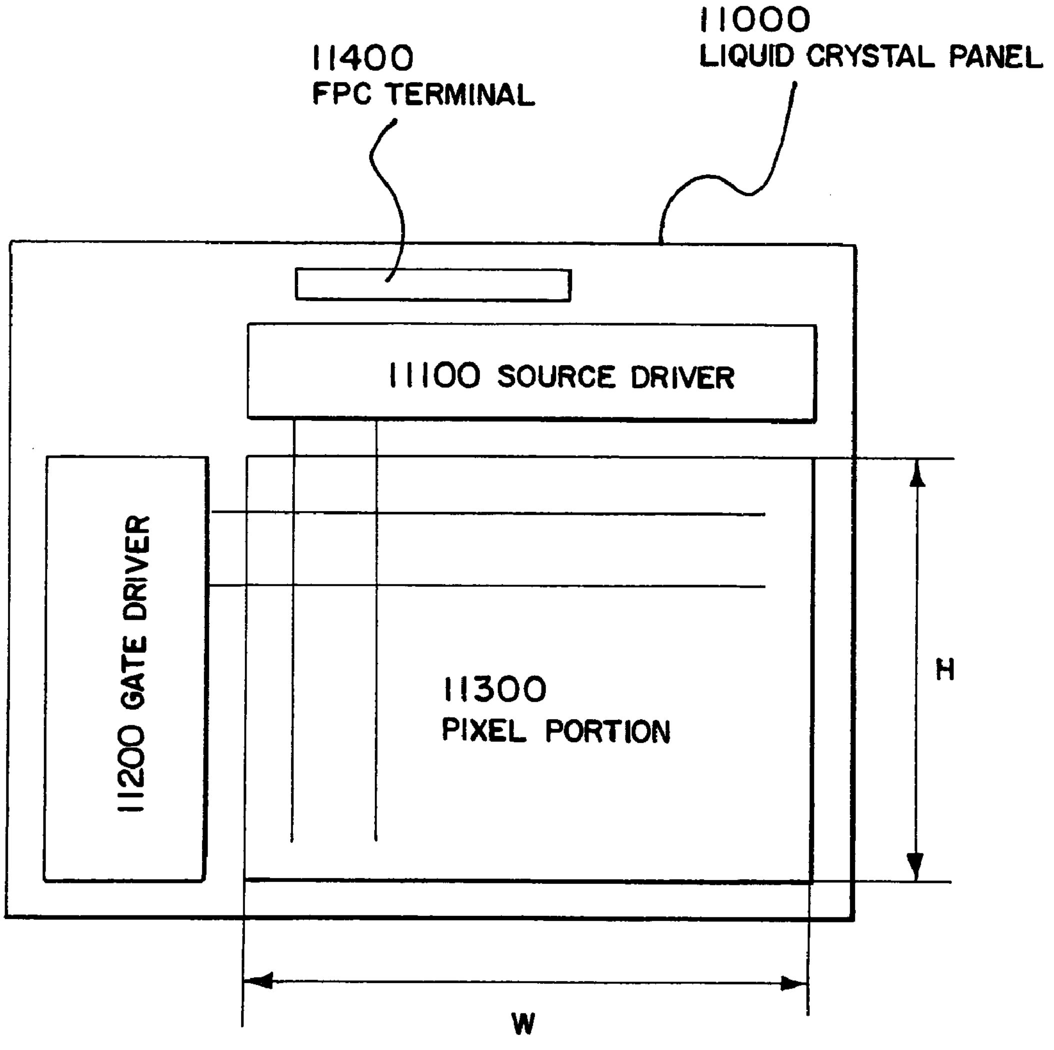
FIG. 17 PRIOR ART
FIG. 17 is a schematic structural diagram showing a liquid crystal panel of prior art.

As shown in FIG. 16, when the video data (VIDEO) is converted by the video converter circuit, each video data is divided into four data sets to create VIDEOn1, VIDEOn2, VIDEOn3, and VIDEOn4. Shown here is an example in which the video data (VIDEO) is divided into four data sets, but the number of divisions is not limited to four.

Embodiment 1

This embodiment gives a description with reference to FIGS. 8A to 12 of an example of a process of manufacturing a liquid crystal panel for a display device of the present invention. In the liquid crystal panel of this embodiment, a pixel portion, a source driver, a gate driver, etc. are integrally formed on a single substrate. For ease of explanation, it is assumed that a pixel TFT, an N-channel TFT for forming an analog switch of a source driver (driver circuit), a P-channel TFT and an N-channel TFT for forming an inverter circuit are formed on the same substrate in the drawings.

Figures 8A, 8B, 8C, 8D:
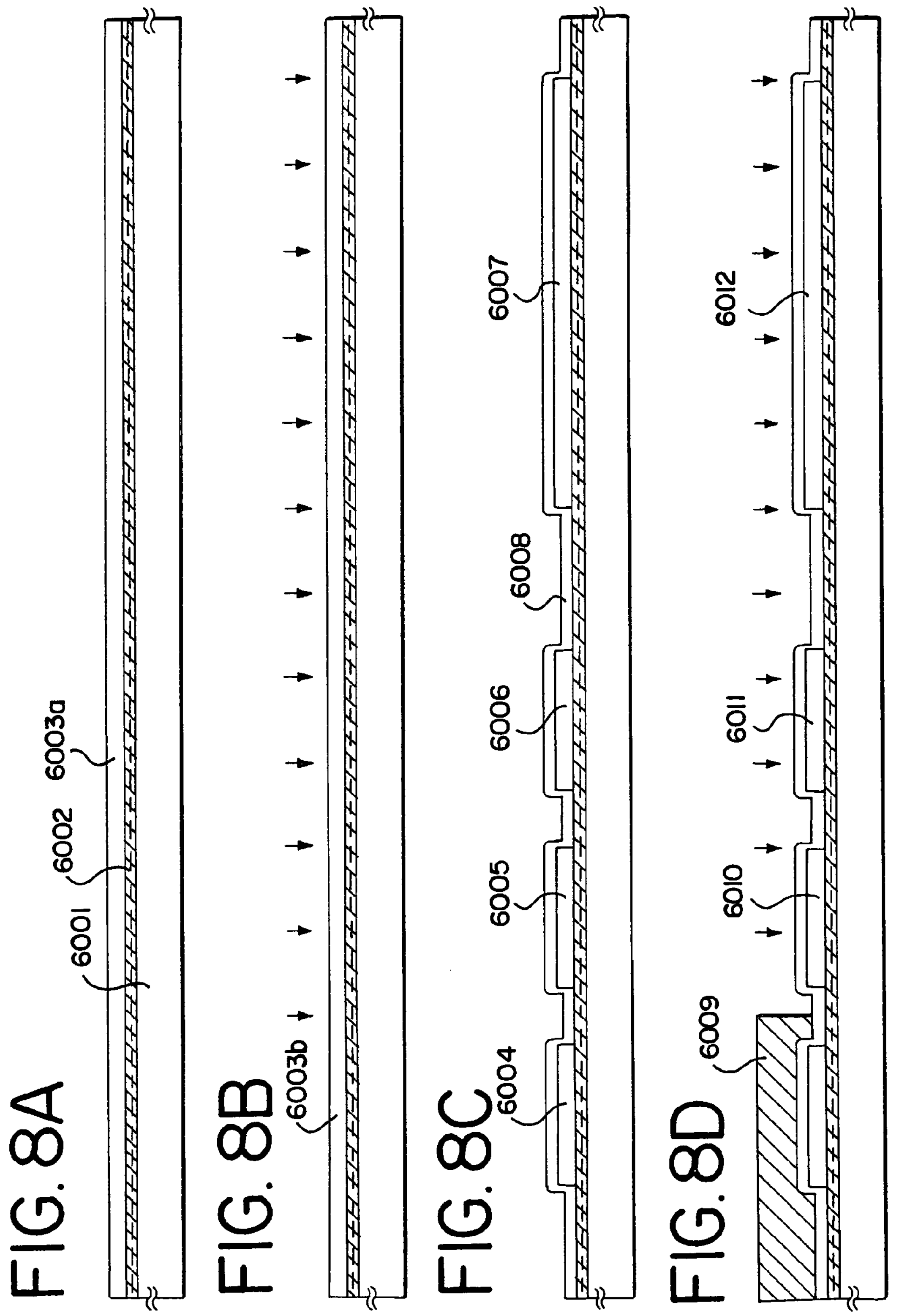
FIGS. 8A to 8D are diagrams showing an example of a process of manufacturing a liquid crystal panel of a liquid crystal display device according to the present invention.

In FIG. 8A, a low-alkaline glass substrate or a quartz substrate can be used as a substrate 6001. In this embodiment, a low-alkaline glass substrate was used. In this case, a heat treatment at a temperature of about 10 to 20° C. below the strain point of glass may be performed in advance. On the surface of this substrate 6001 on which TFTs are to be formed, a base film 6002 such as a silicon oxide film, a silicon nitride film or a silicon oxynitride film is formed in order to prevent the diffusion of impurities from the substrate 6001. For example, a laminate is formed from: a silicon oxynitride film which is fabricated from $SiH_4$, $NH_3$, and $N_2O$ by plasma CVD to a 100 nm thickness; and a silicon oxynitride film which is similarly fabricated from $SiH_4$ and $N_2O$ to a 200 nm thickness.

Next, a semiconductor film 6003*a* that has an amorphous structure and a thickness of 20 to 150 nm (preferably, 30 to 80 nm) is formed by a known method such as plasma CVD or sputtering. In this embodiment, an amorphous silicon film is formed to a thickness of 54 nm by plasma CVD. An amorphous semiconductor film, a microcrystalline semiconductor film, and a compound semiconductor film with an amorphous structure such as an amorphous silicon germanium film may be used for the semiconductor film which has an amorphous structure. Further, the base film 6002 and the amorphous silicon film 6003*a* can be formed by the same deposition method, so that the two films can be formed in succession. By not exposing the base film to the atmospheric air after the formation of the base film, the surface of the base film can be prevented from being contaminated, and as a result the dispersion characteristics of the fabricated TFTs and the variation in the threshold voltage thereof can be reduced. (FIG. 8A).

Then, by a known crystallization technique, a crystalline silicon film 6003*b* is formed from the amorphous silicon film 6003*a*. For example, a laser crystallization method or a thermal crystallization method (solid phase growth method) may be applied. Here, in accordance with the technique disclosed in Japanese Patent Application Laid-Open No. Hei 7-130652, the crystalline silicon film 6003*b* was formed by this crystallization method using a catalytic element. It is preferred that, prior to the crystallization step, heat treatment is carried out at 400 to 500° C. for about one hour although it depends on the amount of hydrogen contained. In other words, the amount of hydrogen contained should be reduced to 5 atomic % or less, before the crystallization step is carried out. The atoms are subjected to re-configuration and become dense when an amorphous silicon film is crystallized; as a result, the thickness of the fabricated crystalline silicon film is reduced by about 1 to 15% of the initial thickness of the amorphous silicon film (54 nm in this embodiment). (FIG. 8B)

Then, the crystalline silicon film 6003*b* is patterned into islands, whereby island semiconductor layers 6004 to 6007 are formed. Thereafter, a mask layer 6008 of a silicon oxide film is formed to a thickness of 50 to 150 nm by plasma CVD or sputtering. (FIG. 8C) In this Embodiment the thickness of the mask layer 6008 is set at 130 nm.

Then, a resist mask 6009 is provided, and, boron (B) was applied as an impurity element at a concentration of about $1\times10^{16}$ to $5\times10^{17}$ atoms/$cm^3$ into the entire surfaces of the island semiconductor layers 6004 to 6007 which become the N-channel type TFTs in order to impart p-type conductivity. The addition of boron (B) here is performed for the purpose of threshold voltage control. The addition of boron (B) may be effected either by ion doping or it may be added simultaneously when the amorphous silicon film is formed. The addition of boron (B) here is not always necessary. (FIG. 8D)

In order to form the LDD regions of the N-channel TFTs in the driver circuit such as the driver, an impurity element imparting n-type conductivity is selectively added to the island semiconductor layers 6010 to 6012. For this purpose, resist masks 6013 to 6016 were formed in advance. As the impurity element imparting the n-type conductivity, phosphorus (P) or arsenic (As) may be used; here, in order to add phosphorus (P), ion doping using phosphine ($PH_3$) was applied. The concentration of phosphorus (P) in the impurity regions 6017 and 6018 thus formed may be set within the range of from $2\times10^{16}$ to $5\times10^{19}$ atoms/$cm^3$. In this specification, the concentration of the impurity element contained in the thus formed impurity regions 6017 to 6019 imparting n-type conductivity is represented by ($n^-$). Further, the impurity region 6019 is a semiconductor layer for forming the storage capacitor of the pixel section; into this region, phosphorus (P) was also added in the same concentration. (FIG. 9A) Thereafter, resist masks 6013 to 6016 are removed.

Figures 9A, 9B, 9C, 9D:
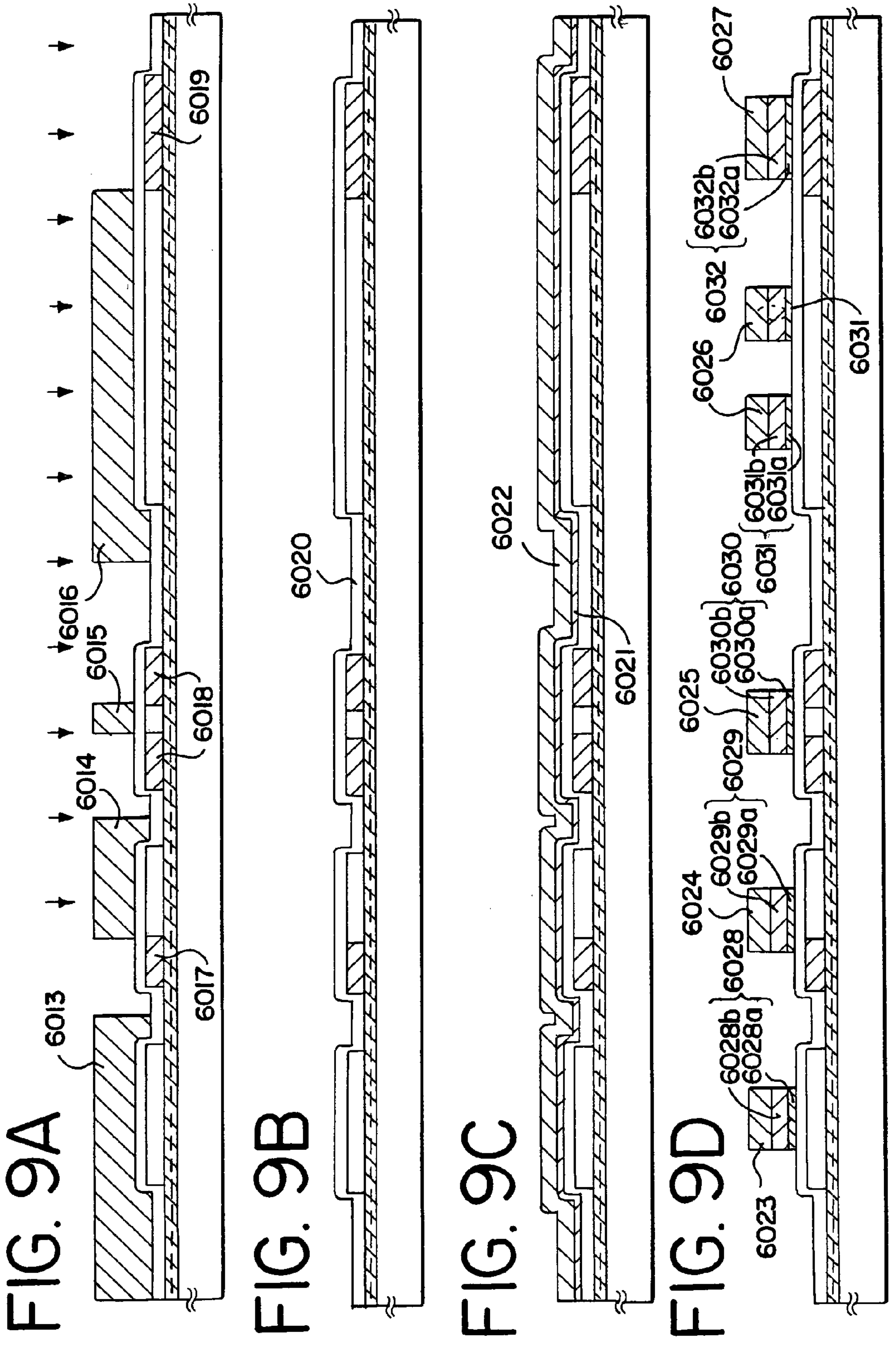
FIGS. 9A to 9D are diagrams showing the exemplary process of manufacturing the liquid crystal panel of the liquid crystal display device according to the present invention.

Next, the mask layer 6008 is removed by hydrofluoric acid or the like, and the step of activating the impurity elements added in the steps shown in FIGS. 8D and 9A is carried out. The activation can be carried out by performing heat treatment in a nitrogen atmosphere at 500 to 600° C. for 1 to 4 hours or by using the laser activation method. Further, both methods may be jointly performed. In this embodiment, the laser activation method was employed, and a KrF excimer laser beam (with a wavelength of 248 nm) was used. In this embodiment, the shape of the laser light is formed into a linear beam, and the entire surface of the substrate on which island semiconductor layers are formed is scanned under the condition that the oscillation frequency was 5 to 50 Hz, the energy density was 100 to 500 mJ/$cm^2$, and the overlap ratio of the linear beam was 80 to 98%. Note that there is no item of the laser light irradiation condition that is subjected to limitation, and they can be appropriately determined.

Then, a gate insulating film 6020 is formed from an insulating film comprising silicon to a thickness of 10 to 150 nm, by plasma CVD or sputtering. For example, a silicon oxynitride film is formed to a thickness of 120 nm. For the gate insulating film, another insulating film comprising silicon may be used in the form of single layer or a laminate structure. (FIG. 9B)

Next, in order to form a gate electrode, a first conductive layer is deposited. This first conductive layer may be comprised of a single layer but may also be comprised of a laminate consisting of two or three layers. In this embodiment, a conductive layer (A) 6021 comprising a conductive metal nitride film and a conductive layer (B) 6022 comprising a metal film are laminated. The conductive layer (B) 6022 may be formed of an element selected from the group consisting of tantalum (Ta), titanium (Ti), molybdenum (Mo) and tungsten (W) an alloy comprised mainly of the above-mentioned elements, or an alloy film (typically, an Mo—W alloy film or an Mo—Ta alloy film) comprised of a combination of the above-mentioned elements, while the conductive layer (A) 6021 comprises tantalum nitride (TaN), tungsten nitride (WN), titanium nitride (TiN), or molybdenum nitride (MoN). Further, as substitute materials of the conductive film (A) 6021, tungsten silicide, titanium silicide, or molybdenum silicide may also be used. The conductive layer (B) 6022 may preferably have its impurity concentration reduced in order to decrease the resistance thereof; in particular, as for the oxygen concentration, the concentration may be set to 30 ppm or less. For example, tungsten (W) could result in realizing a resistivity of 20 $\mu\Omega$cm or less by rendering the oxygen concentration thereof to 30 ppm or less.

The conductive layer (A) 6021 may be set to 10 to 50 nm (preferably, 20 to 30 nm), and the conductive layer (B) 6022 may be set to 200 to 400 nm (preferably, 250 to 350 nm). In this embodiment, as the conductive layer (A) 6021, a tantalum nitride film with a thickness of 50 nm was used, while, as the conductive layer (B) 6022, a Ta film with a thickness of 350 nm was used, both films being formed by sputtering. In case of performing sputtering here, if a suitable amount of Xe or Kr is added into the sputtering gas Ar, the internal stress of the film formed is alleviated, whereby the film can be prevented from peeling off. Though not shown, it is effective to form a silicon film, into which phosphorus (P) is doped, to a thickness of about 2 to 20 nm underneath the conductive layer (A) 6021. By doing so, the adhesiveness of the conductive film formed thereon can be enhanced, and at the same time, oxidation can be prevented. In addition, the alkali metal element slightly contained in the conductive film (A) or the conductive film (B) can be prevented from diffusing into the gate insulating film 6020. (FIG. 9C)

Next, resist masks 6023 to 6027 are formed, and the conductive layer (A) 6021 and the conductive layer (B) 6022 are etched together to form gate electrodes 6028 to 6031 and a capacitor wiring 6032. The gate electrodes 6028 to 6031 and the capacitor wiring 6032 are formed in such a manner that the layers 6028*a* to 6032*a* comprised of the conductive layer (A) and the layers 6028*b* to 6032*b* comprised of the conductive layer (B) are formed as one body respectively. In this case, the gate electrodes 6028 to 6030 formed for the driver circuit are formed so as to overlap the portions of the impurity regions 6017 and 6018 through the gate insulating film 6020. (FIG. 9D)

Figures 10A, 10B, 10C, 10D:
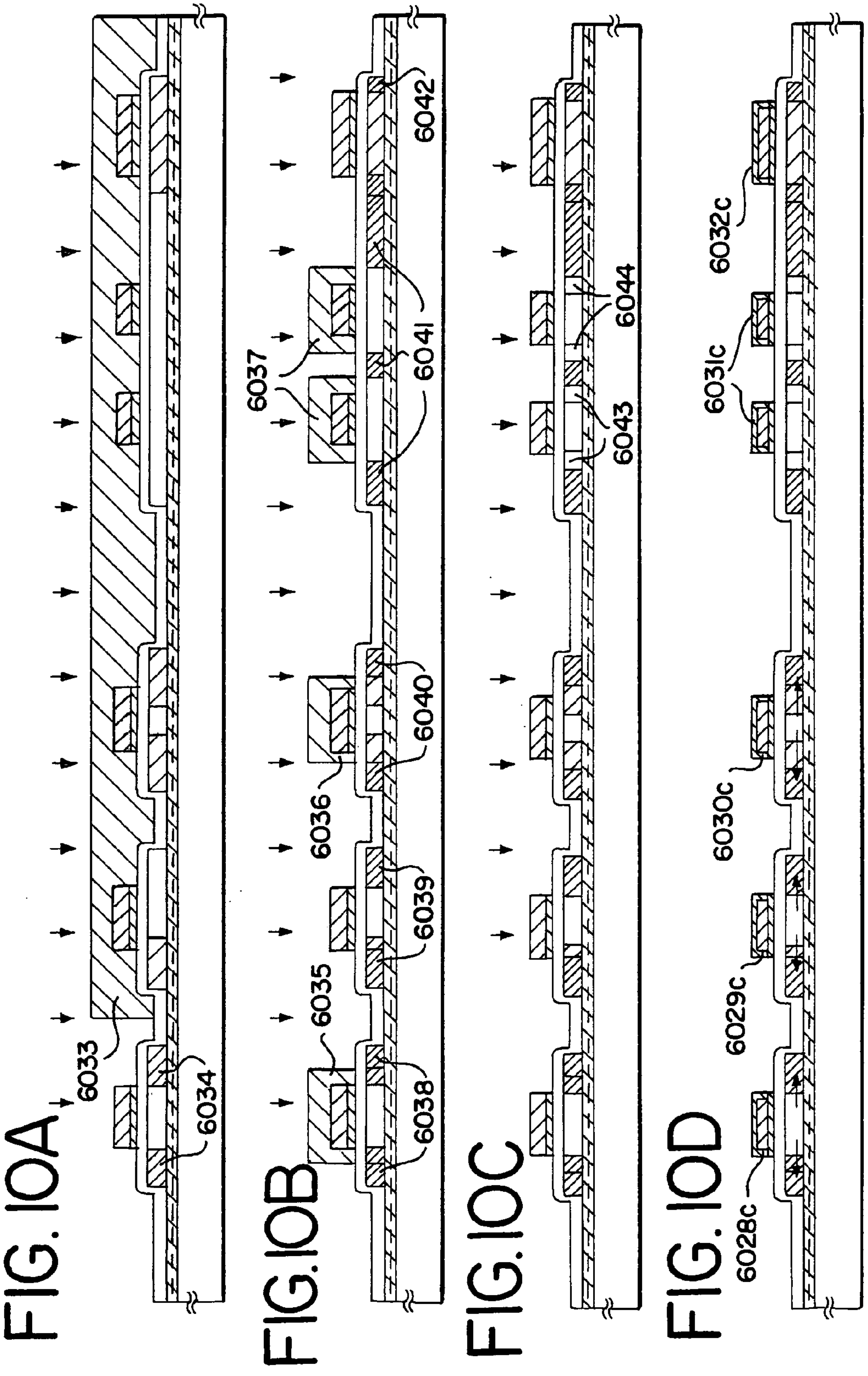
FIGS. 10A to 10D are diagrams showing the exemplary process of manufacturing the liquid crystal panel of the liquid crystal display device according to the present invention.

Then, in order to form the source region and the drain region of the P-channel TFT in the driver circuit, the step of adding an impurity element imparting p-type conductivity is carried out. Here, by using the gate electrode 6028 as a mask, impurity regions are formed in a self-alignment manner. In this case, the region in which the N-channel TFTs will be formed is covered with a resist mask 6033 in advance. Thus, impurity regions 6034 were formed by ion doping using diborane ($B_2H_6$). The concentration of boron (B) in this region is brought to $3\times10^{20}$ to $3\times10^{21}$ atoms/cm$^3$. In this specification, the concentration of the impurity element imparting p-type conductivity contained in the impurity regions 6034 is represented by ($p^{++}$). (FIG. 10A)

Next, in the N-channel TFTs, impurity regions that function as source regions or drain regions were formed. Resist masks 6035 to 6037 were formed, and an impurity element for imparting the n-type conductivity was added to form impurity regions 6038 to 6042. This was carried out by ion doping using phosphine ($PH_3$), and the phosphorus (P); the concentration in these regions was set within a range of $1\times10^{20}$ to $1\times10^{21}$ atoms/cm$^3$. In this specification, the concentration of the impurity element imparting the n-type conductivity contained in the impurity regions 6038 to 6042 formed here is represented by ($n^+$). (FIG. 10B)

In the impurity regions 6038 to 6042, the phosphorus (P) or boron (B) that are added in the preceding steps are contained; however, as compared with the impurity element concentration, phosphorus is added here at a sufficiently high concentration, so that the influence by the phosphorus (P) or boron (B) added in the preceding steps need not be taken into consideration. Further, the concentration of the phosphorus (P) that is added into the impurity regions 6038 is ½ to ⅓ of the concentration of the boron (B) added in the step shown in FIG. 10A; and thus, the p-type conductivity was secured, and no influence was exerted on the characteristics of the TFTs.

Then, the step of adding an impurity imparting n-type conductivity for formation of the LDD regions of the N-channel TFT in the pixel section was carried out. Here, by using the gate electrode 6031 as a mask, the impurity element for imparting n-type conductivity was added in a self-alignment manner. The concentration of phosphorus (P) added was $1\times10^{16}$ to $5\times10^{18}$ atoms/cm$^3$; by thus adding phosphorus at a concentration lower than the concentrations of the impurity elements added in the steps shown in FIGS. 9A, 10A and 10B, only impurity regions 6043 and 6044 are substantially formed. In this specification, the concentration of the impurity element imparting the n-type conductivity contained in the impurity regions 6043 and 6044 is represented by ($n^-$). (FIG. 10C)

Here, a film such as SiON film or the like may be formed into 200 nm thickness as an interlayer film for preventing peeling of gate electrode Ta.

Thereafter, in order to activate the impurity elements, which were added at their respective concentrations for imparting n-type or p-type conductivity, a heat treatment step is carried out. This step can be carried out by furnace annealing, laser annealing or rapid thermal annealing (RTA). Here, the activation step was performed by furnace annealing. Heat treatment is carried out in a nitrogen atmosphere with an oxygen concentration of 1 ppm or less, preferably 0.1 ppm or less, at 400 to 800° C., generally at 500 to 600° C.; in this embodiment, the heat treatment was carried out at 500° C. for 4 hours. Further, in case a substrate such as a quartz substrate which has heat resistance is used as the substrate 6001, the heat treatment may be carried out at 800° C. for one hour; in this case, the activation of the impurity elements and the formation of junctions between the impurity regions into which the impurity element was added and the channel-forming region could be performed well. Note, that in cases in which Ta is used in the above stated interlayer film for preventing peeling of gate electrode such effect cannot be obtained.

By this heat treatment, of the metal films 6028*b* to 6032*b*, which form the gate electrodes 6028 to 6031 and the capacitor wiring 6032, conductive layers (C) 6028*c* to 6032*c* are formed with a thickness of 5 to 80 nm as measured from the surface. For example, in cases where the conductive layers (B) 6028*b* to 6032*b* are made of tungsten (W), tungsten nitride (WN) is formed; when tantalum (Ta) is used, tantalum nitride (TaN) can be formed. Further, the conductive layers (C) 6028*c* to 6032*c* can be similarly formed by exposing the gate electrodes 6028 to 6031 and the capacitor wiring 6032 to a plasma atmosphere containing nitrogen using nitrogen, ammonia or the like. Further, heat treatment was carried out in an atmosphere containing 3 to 100% of hydrogen at 300 to 450° C. for 1 to 12 hours, thus performing the step of hydrogenating the island semiconductor layers. This step is a used for terminating the dangling bonds of the semiconductor layers by the thermally excited hydrogen. As another means for the hydrogenation, plasma hydrogenation (using the hydrogen excited by plasma) may be performed.

In cases where the island semiconductor layers were fabricated from an amorphous silicon film by the crystallization method using a catalytic element, a trace amount of the catalytic element remained in the island semiconductor layers. Of course, it is possible to complete the TFT even in such a state; however, it was more preferable to remove the residual catalytic element at least from the channel-forming region. As one of the means for removing this catalytic element, there is the means utilizing the gettering function of phosphorus (P). The concentration of phosphorus (P) necessary to perform gettering is at the same level as that of the impurity region ($n^+$) which was formed in the step shown in FIG. 10B; by the heat treatment at the activation step carried out here, the catalytic element could be gettered from the channel-forming region of the N-channel and the P-channel TFTs. (FIG. 10D)

A first interlayer insulating film 6045 is formed of a silicon oxide film or a silicon oxynitride film with a thickness of 500 to 1500 nm, and contact holes reaching the source regions or the drain regions which are formed in the respective island semiconductor layers, are also formed. In addition, source wirings 6046 to 6049 and drain wirings 6050 to 6053 are formed. (FIG. 11A) Though not shown, in this embodiment, these electrodes were formed from a three-layer structure which was constituted by continuously forming by sputtering a Ti film with a thickness of 100 nm, an aluminum film containing Ti and having a thickness of 500 nm, and a Ti film with a thickness of 150 nm [by sputtering].

Figure 11A:
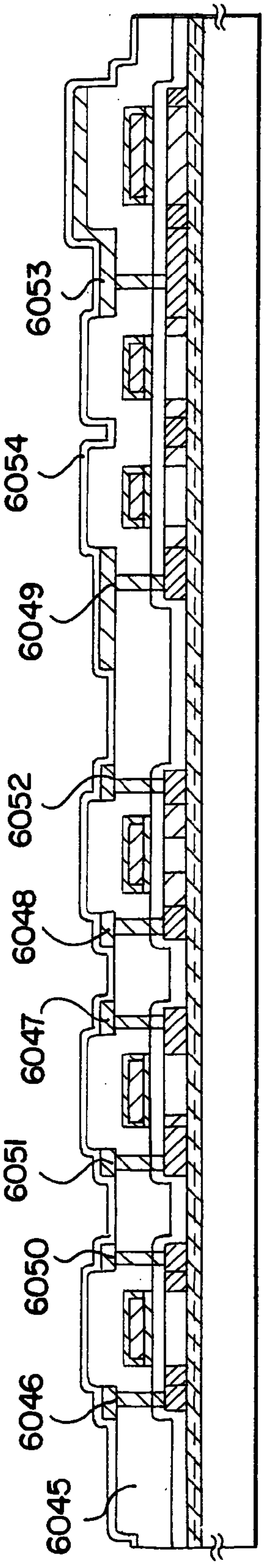
FIGS. 11A and 11B are diagrams showing the exemplary process of manufacturing the liquid crystal panel of the liquid crystal display device according to the present invention.

Next, a passivation film 6054 is formed to a thickness of 50 to 500 nm (typically, 100 to 300 nm) using, a silicon nitride film, a silicon oxide film or a silicon oxynitride film [is formed to a thickness of 50 to 500 nm (typically, 100 to 300 nm)]. In this Embodiment, the passivation film 6054 is made into a laminate film of a 50 nm thick silicon nitride film and a 24.5 nm silicon oxide film. In cases that a hydrogenating treatment is carried out, a desirable result was obtained with respect to the enhancement in characteristics of the TFTs. For example, it is preferable to carry out heat treatment in an atmosphere containing 3 to 100% of hydrogen at 300 to 450° C. for 1 to 12 hours; or, in the case that the plasma hydrogenation method is employed, a similar effect is obtained. Here, openings may be formed in the passivation film 6054 at the position at which contact holes for connecting the pixel electrodes and drain wirings which will be formed later. (FIG. 11A)

Figure 11B:
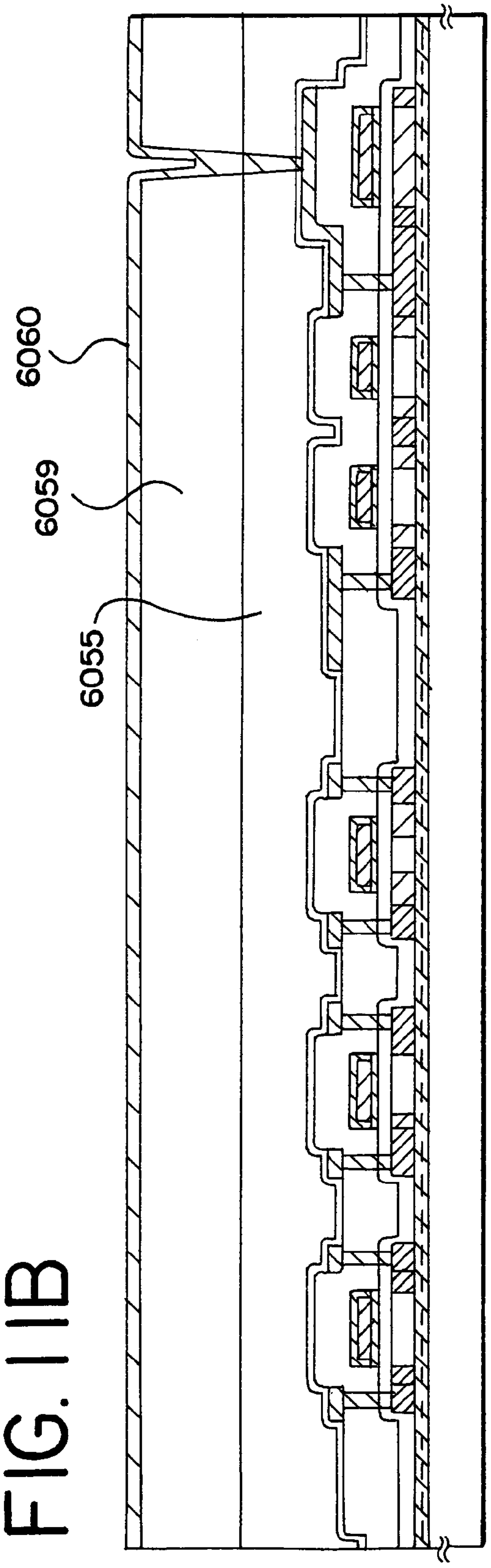

Thereafter, a second interlayer insulating film 6055 comprised of an organic resin is formed to a thickness of 1.0 to 1.5 $\mu$m. As the organic resin, polyimide, acrylic, polyamide, polyimideamide, BCB (benzocyclobutene), etc., can be used. Here, acrylic of the type that, after applied to the substrate, thermally polymerizes was used; it was fired at 250° C., whereby the second interlayer insulating film was formed. (FIG. 11B)

A capacitor for a D/A converter circuit is then formed here. An electrode which should function as the electrode of the capacitor of the D/A converter circuit is formed from the same wiring layer as the drain wiring. All of the second interlayer insulating film 6055 is removed in the areas above the electrode. (Not shown) A black matrix is then formed. (Not shown) In this embodiment, the black matrix is a laminate structure formed from a Ti film of 100 nm and an alloy film of Al and Ti with a thickness 300 nm. Accordingly, a capacitor of the D/A converter circuit is formed in this embodiment between the electrode and the black matrix.

Thereafter, a third interlayer insulating film 6059 is formed from an organic resin into 1.0 to 1.5 $\mu$m thickness. As the organic resin, similar resins as the second interlayer insulating film may be used. Here a polyimide of a type that thermally polymerizes after application to the substrate is used and the film is formed by firing at 300° C.

Then, a contact hole reaching the drain wiring 6053 is formed in the second interlayer insulating film 6055 and the third interlayer insulating film 6059, and a pixel electrode 6060 is formed. In forming a transmission type liquid crystal panel of the present invention, a transparent conductive film of ITO or the like is used as the pixel electrode 6060. (FIG. 11B)

In this way, a substrate having the TFTs of the driver circuit and the pixel TFTs of the pixel section on the same substrate can be accomplished. In the driver circuit, there are formed a P-channel TFT 6101, a first N-channel TFT 6102 and a second N-channel TFT 6103, while, in the pixel portion, there are formed a pixel TFT 6104 and a storage capacitor 6105. (FIG. 12) In this specification, such a substrate is called active matrix substrate for convenience.

Next the processes for forming a transmission type liquid crystal panel from an active matrix substrate manufactured through the above processes is described.

Figure 12:
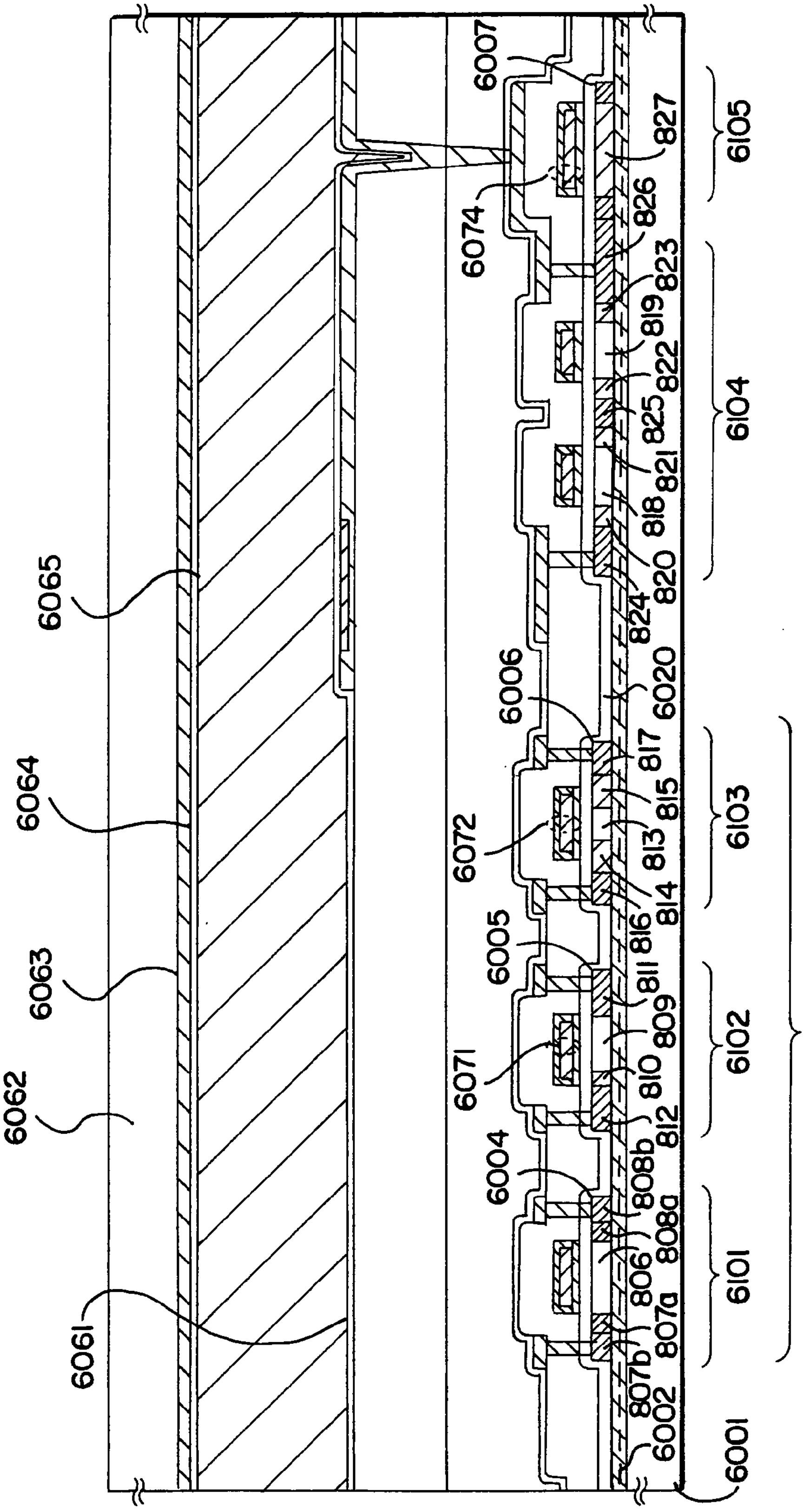
FIG. 12 is a diagram showing the exemplary process of manufacturing the liquid crystal panel of the liquid crystal display device according to the present invention.

An alignment film 6061 is formed on the active matrix substrate of the type shown in FIG. 12. Polyimide is used as the alignment film 6061 in the present embodiment. An opposing substrate is next prepared. The opposing substrate comprises a glass substrate 6062, an opposing electrode 6063 comprising a transparent conductive film and an alignment film 6064.

Note that in the present embodiment a polyimide film of the type in which liquid crystal molecules are oriented in parallel with respect to the substrate is used as the alignment film. By performing a rubbing treatment after forming the alignment film, liquid crystal molecules are made to orient in parallel with a prescribed pre-tilt angle.

Next the active matrix substrate which went through the above processes and the opposing substrate are stuck together through a sealant, spacers (neither shown) or the like by a known cell assembly process. Thereafter, liquid crystal 6065 is injected between the both substrates and completely sealed with a sealant (not shown). A transmission type liquid crystal panel as shown in FIG. 12 is thus completed.

Note that in the present embodiment, the transmission type liquid crystal panel is made to display by a TN (twist) mode. Therefore, a polarizing plate (not shown) is disposed on the transmission type liquid crystal panel.

The P-channel TFT 6101 in the driver circuit has a channel-forming region 806, source regions 807*a* and 807*b* and drain regions 808*a* and 808*b* in the island semiconductor layer 6004. The first N-channel TFT 6102 has a channel-forming region 809, an LDD region 810 overlapping the gate electrode 6071 (such an LDD region will hereinafter be referred to as Lov), a source region 811 and a drain region 812 in the island semiconductor layer 6005. The length in the channel direction of this Lov region is set to 0.5 to 3.0 $\mu$m, preferably 1.0 to 1.5 $\mu$m. A second N-channel TFT 6103 has a channel-forming region 813, LDD regions 814 and 815, a source region 816 and a drain region 817 in the island semiconductor layer 6006. In these LDD regions, there are formed Lov regions and LDD regions which do not overlap the gate electrode 6072 (such an LDD region will hereafter be referred as Loff); and the length in the channel direction of this Loff region is 0.3 to 2.0 μm, preferably 0.5 to 1.5 μm. The pixel TFT 6104 has channel-forming regions 818 and 819, Loff regions 820 to 823, and source or drain regions 824 to 826 in the island semiconductor layer 6007. The length in the channel direction of the Loff regions is 0.5 to 3.0 μm, preferably 1.5 to 2.5 μm. In addition, offset regions (not shown) are formed between the channel forming regions 818 and 819 of the pixel TFT 6104 and Loff regions 820 to 823 that are LDD regions of the pixel TFT. Further, the storage capacitor 6105 comprises capacitor wiring 6074, an insulating film composed of the same material as the gate insulating film 6020 and a semiconductor layer 827 which is connected to the drain region 826 of the pixel TFT 6104 and in which an impurity element for imparting the N-type conductivity is added. In FIG. 12, the pixel TFT 6104 is of the double gate structure, but may be of the single gate structure, or may be of a multi-gate structure in which a plurality of gate electrodes are provided.

As described above, the TFT structures that constitute each circuit are optimized in accordance with the specifications required by the pixel TFT and the driver, and it is possible to improve the operational performance and reliability of the liquid crystal panel.

A transmission type liquid crystal panel is described in this embodiment. However, liquid crystal panels of the present invention is not limited to this type, and may be applied also to a reflection type liquid crystal panel.

Embodiment 2

Various liquid crystals other than the nematic liquid crystal may be used for the above liquid crystal panel of the liquid crystal display device of the present invention. For instance, usable liquid crystals are the ones disclosed in: 1998, SID Digest, 782, "Characteristics and Driving Scheme of Polymer-Stabilized Monostable FLCD Exhibiting Fast Response Time and High Contrast Ratio with Gray-Scale Capability" by H. Furue et al.; 1997, SID DIGEST, 841, "A Full-Color Thresholdless Antiferroelectric LCD Exhibiting Wide Viewing Angle with Fast Response Time" by T. Yoshida et al.; 1996, J. Mater. Chem. 6 (4), 671–673, "Thresholdless antiferroelectricity in liquid crystals and its application to displays" by S. Inui et al.; and U.S. Pat. No. 5,594,569.

Figure 13:
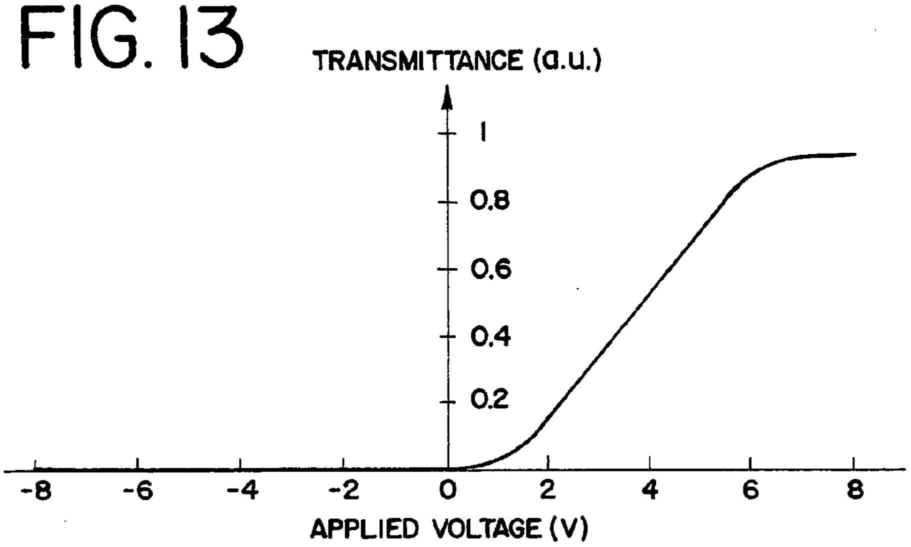
FIG. 13 is a graph showing an applied voltage—transmittance characteristic of a ferroelectric liquid crystal that exhibits a Half-V shape type electro optical characteristic.

FIG. 13 shows an electro optical characteristic of a monostable FLC (ferroelectric liquid crystal) obtained by employing an FLC that exhibits a transition series of isotropic phase—cholesteric phase—chiral smectic C phase, causing cholesteric phase—chiral smectic C phase transition with DC voltage applied to the FLC, and making the cone edge almost coincide with the rubbing direction. The display mode of ferroelectric liquid crystals having a characteristic as shown in FIG. 13 is called "Half-V shape switching mode". The axis of ordinate of the graph shown in FIG. 13 indicates transmittance (arbitrary unit), and the axis of abscissa indicates applied voltage. Details of the "Half-V shape switching mode" are discussed in "Half-V shape Switching Mode FLCD", Terada et al., Extended Abstracts of the 46th Convention of The Japan Society of Applied Physics, p. 1316, March 1999, and "Time-division Full Color LCD Using Ferroelectric Liquid Crystal", Yoshihara et al., Liquid Crystal Vol. 3, No. 3, p. 190.

As shown in FIG. 13, using such a ferroelectric mixed liquid crystal allows liquid crystal panels to be driven at a low voltage and to display on gray-scale basis. The ferroelectric liquid crystals showing the electro optical characteristic as such may also be used for the liquid crystal panel of the liquid crystal display device according to the present invention.

Liquid crystals exhibiting antiferroelectric phase in a certain temperature range are called antiferroelectric liquid crystals (AFLC). Among mixed liquid crystals having antiferroelectric liquid crystals, there are ones called thresholdless antiferroelectric mixed liquid crystals showing an electro optical response characteristic in which transmittance continuously changes in relation to the electric field. Some thresholdless antiferroelectric liquid crystals show an electro optical response characteristic of so-called V shape type, and there have been found ones whose drive voltage is about ±2.5 V (cell thickness thereof is about 1 μm to 2 μm).

In thresholdless antiferroelectric mixed liquid crystals, generally, spontaneous polarization is large and the dielectric constant of the liquid crystals themselves is high. For this reason, a relatively large storage capacitor is needed for a pixel when thresholdless antiferroelectric mixed liquid crystals are used for liquid crystal display devices. It is thus preferable to employ a thresholdless antiferroelectric mixed liquid crystal whose spontaneous polarization is small.

To use such a thresholdless antiferroelectric mixed liquid crystal for the liquid crystal display device of the present invention realizes low voltage driving, simultaneously realizing power consumption reduction.

Embodiment 3

Display devices of the present invention can be used by incorporating them into various electronic equipment.

Examples of the electronic equipment include a video camera, a digital camera, a projector (rear type or front type), a head mounted display (a goggle type display), a game machine, a car navigation system, a personal computer and a portable information terminal (a mobile computer, a cellular telephone, an electronic book, etc.). FIGS. 14A and 14B, and FIGS. 15A to 15F show some examples of them.

Figure 14A:
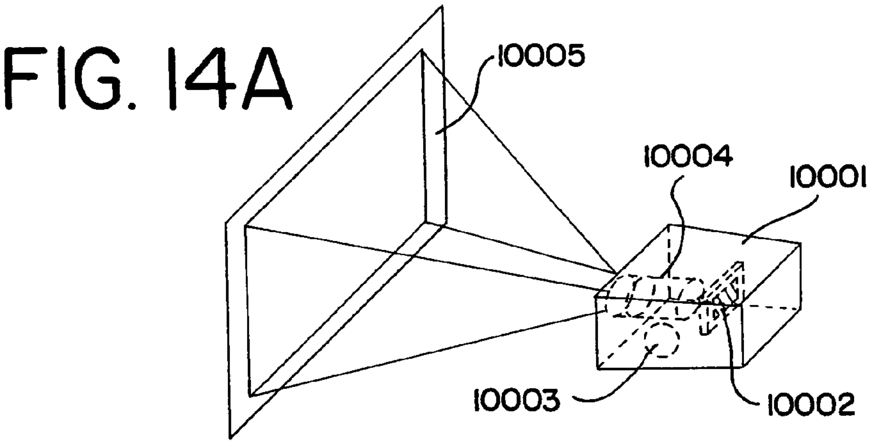
FIGS. 14A and 14B are diagrams showing examples of electronic equipment having incorporated therein a liquid crystal display device of the present invention.

FIG. 14A shows the front type projector comprising a main body 10001, a liquid crystal display 10002 of the present invention, a light source 10003, an optical system 10004, and a screen 10005. It is noted that although FIG. 14A shows the front projector in which one liquid crystal display is built in, a front type projector of higher resolution and higher definition can be realized by combining three liquid crystal display devices (corresponding to light of R, G and B, respectively).

Figure 14B:
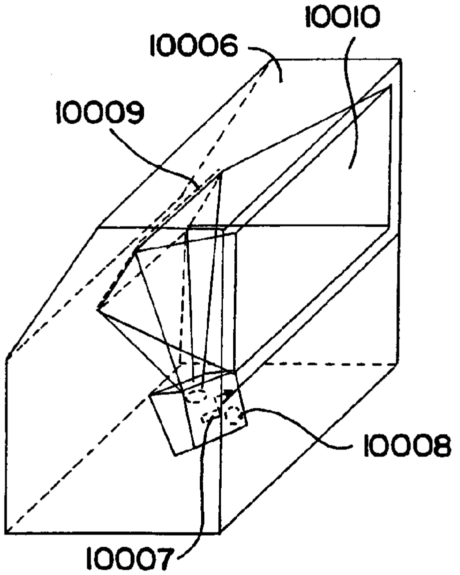

FIG. 14B shows the rear type projector comprising a main body 10006, a liquid crystal display device 10007 of the present invention, a light source 10008, a reflector 10009 and a screen 10010. FIG. 14B shows a rear projector in which three liquid crystal displays are built in (corresponding to light of R, G and B, respectively). Further, the rear type projector in which one liquid crystal display is built in can be provided.

Figure 15A:
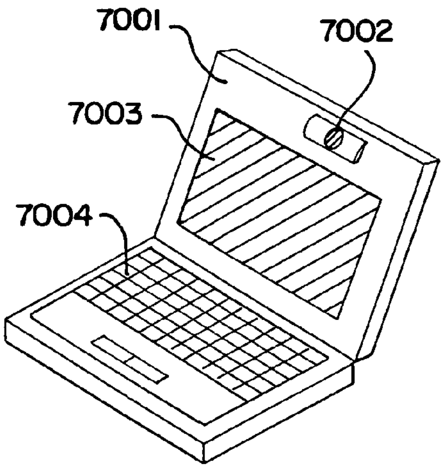
FIGS. 15A to 15F are diagrams showing examples of electronic equipment having incorporated therein one or more liquid crystal display devices of the present invention.

FIG. 15A shows a personal computer, which comprises: a main body 7001; an image input section 7002; a liquid display device of the present invention 7003; and a keyboard 7004.

Figure 15B:
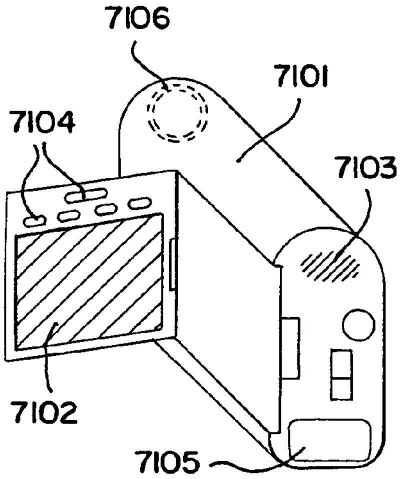

FIG. 15B shows a video camera, which comprises: a main body 7101; a liquid display device of the present invention 7102; a sound input section 7103; an operation switch 7104; a battery 7105; and an image receiving section 7106.

Figure 15C:
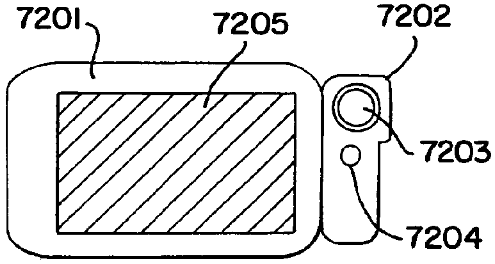

FIG. 15C shows a mobile computer, which comprises: a main body 7201; a camera section 7202; an image receiving section 7203; an operation switch 7204; and a display device of the present invention 7205.

Figure 15D:
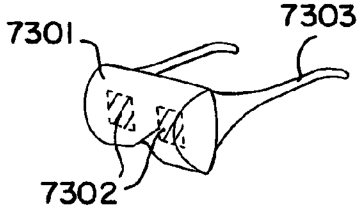

FIG. 15D shows a goggle type display, which comprises: a main body 7301; a liquid display device of the present invention 7302; and an arm section 7303.

Figure 15E:
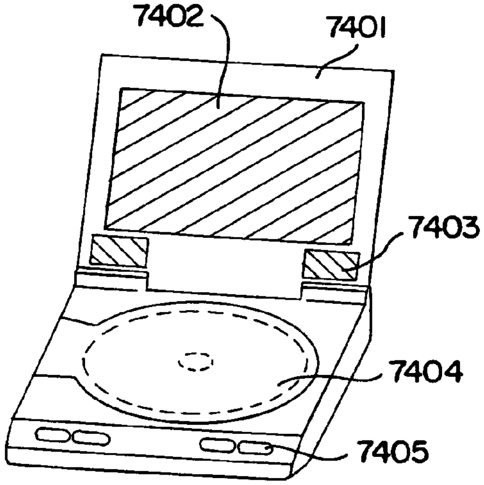

FIG. 15E shows a player employing a recording medium storing a program (hereinafter called the recording medium). It comprises a main body 7401, a liquid display device of the present invention 7402, a speaker unit 7403, a recording medium 7404 and an operation switch 7405. Note that by using DVD (digital versatile disc), CD, etc. as a recording medium of this device, music appreciation, film appreciation, games or Internet use can be performed.

Figure 15F:
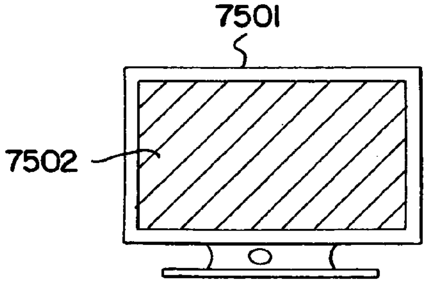

FIG. 15F shows a display device using a liquid crystal display device of the present invention. It comprises a main body 7501 and a liquid crystal display device of the present invention 7502.

As described above, the applicable range of the present invention is very large, and it can be applied to electronic equipment of various fields.

The present invention is applied to not only a liquid crystal display device but other devices such as an EL display device. According to the present invention, a display device with a small size liquid crystal panel can be obtained even when the area a source drive occupies is large.

What is claimed is:

1. A display device comprising:

a pixel portion including m×n pixels (m and n are both natural numbers and satisfy the relation m<n), said pixels each having a TFT;

a gate driver having a first N-channel TFT for feeding n gate signal lines with selection signals;

a source driver having a second N-channel TFT for feeding m source signal lines with video data; and a video data converter circuit, wherein said video data converter converts a digital video datum (h, k) {(h=1, 2, 3, . . . , m−1, m) and (k=1, 2, 3, . . . , n−1, n)} into {m×(k−1)+h}-th video datum, and wherein said TFT has a first LDD region not overlapped by a gate electrode of said TFT, and each of said first N-channel TFT and said second N-channel TFT has a second LDD region overlapped by gate electrodes of said first N-channel TFT and said second N-channel TFT respectively.

2. A rear projector using three display devices according to claim 1.

3. A front projector using three display devices according to claim 1.

4. A rear projector using one display device according to claim 1.

5. A front projector using one display device according to claim 1.

6. An electronic equipment comprising the display device according to claim 1 is selected from the group consisting of a head mount display, a computer, a video camera, a DVD player, and a display apparatus.

7. The display device according to claim 1 is a liquid crystal display device.

8. A display device comprising:

a pixel portion including m×n pixels (in a pixel (h, k), (h=1, 2, 3, . . . , m−1, m) and (k=1, 2, 3, . . . , n−1, n), with m and n both being natural numbers and satisfying the relation m<n), said pixels each having a TFT;

a gate driver having a first N-channel TFT for feeding n gate signal lines with selection signals;

a source driver having a second N-channel TFT for feeding m source signal lines with video data; and a video data converter circuit, wherein said video data converter converts a digital video datum (h, k) into {m×(k−1)+h}-th video datum, and wherein said TFT has a first LDD region not overlapped by a gate electrode of said TFT, and each of said first N-channel TFT and said second N-channel TFT has a second LDD region overlapped by gate electrodes of said first N-channel TFT and said second N-channel TFT respectively.

9. A rear projector using three display devices according to claim 8.

10. A front projector using three display devices according to claim 8.

11. A rear projector using one display device according to claim 8.

12. A front projector using one display device according to claim 8.

13. An electronic equipment comprising the display device according to claim 8 is selected from the group consisting of a head mount display, a computer, a video camera, a DVD player, and a display apparatus.

14. The display device according to claim 8 is a liquid crystal display device.

15. A display device comprising:

a pixel portion including m×n pixels (m and n are both natural numbers and satisfy the relation m<n), said pixels each having a TFT;

a gate driver having a first N-channel TFT for feeding n gate signal lines with selection signals;

a source driver having a second N-channel TFT for feeding m source signal lines with video data; and a video data converter circuit, wherein said video data converter converts a digital video datum (h, k) {(h=1, 2, 3, . . . , m−1, m) and (k=1, 2, 3, . . . , n−1, n)} into {m×(k−1)+h}-th video datum;

wherein said video data converter circuit has a video formatter, a memory and an address generator, and wherein said TFT has a first LDD region not overlapped by a gate electrode of said TFT, and each of said first N-channel TFT and said second N-channel TFT has a second LDD region overlapped by gate electrodes of said first N-channel TFT and said second N-channel TFT respectively.

16. An electronic equipment comprising the display device according to claim 15 is selected from the group consisting of a front projector, a rear projector, a head mount display, a computer, a video camera, a DVD player, and a display apparatus.

17. The display device according to claim 15 is a liquid crystal display device.

18. A rear projector using three display devices according to claim 15.

19. A front projector using three display devices according to claim 15.

20. A rear projector using one display device according to claim 15.

21. A front projector using one display device according to claim 15.

22. A display device comprising:

a pixel portion including m×n pixels (m and n are both natural numbers and satisfy the relation m<n), said pixels each having a TFT;

a gate driver having a first N-channel TFT for feeding n gate signal lines with selection signals;

a source driver having a second N-channel TFT for feeding m source signal lines with video data; and a video data converter circuit, wherein said video data converter converts a digital video datum (h, k) {(h=1, 2, 3, . . . , m−1, m) and (k=1,2,3, . . . , n−1, n)} into {m×(k−1)+h}-th video datum, wherein said gate driver is formed at a lateral side of said pixel portion, wherein said source driver is formed at a longitudinal side of said pixel portion, and wherein said TFT has a first LDD region not overlapped by a gate electrode of said TFT, and each of said first N-channel TFT and said second N-channel TFT has a second LDD region overlapped by gate electrodes of said first N-channel TFT and said second N-channel TFT respectively.

23. An electronic equipment comprising the display device according to claim 22 is selected from the group consisting of a front projector, a rear projector, a head mount display, a computer, a video camera, a DVD player, and a display apparatus.

24. The display device according to claim 22 is a liquid crystal display device.

25. A rear projector using three display devices according to claim 22.

26. A front projector using three display devices according to claim 22.

27. A rear projector using one display device according to claim 22.

28. A front projector using one display device according to claim 22.

29. A display device comprising:

a pixel portion including m×n pixels (m and n are both natural numbers and satisfy the relation m<n), said pixels each having a TFT;

a gate driver having a first N-channel TFT for feeding n gate signal lines with selection signals;

a source driver having a second N-channel TFT for feeding m source signal lines with video data; and a video data converter circuit, wherein said video data converter converts a digital video datum (h, k) {(h=1, 2, 3, . . . , m−1, m) and (k=1, 2, 3, . . . , n−1, n)} into {m×(k−1)+h}-th video datum, wherein said n gate signal lines are vertical and said m source signal lines are horizontal, and wherein said TFT has a first LDD region not overlapped by a gate electrode of said TFT, and each of said first N-channel TFT and said second N-channel TFT has a second LDD region overlapped by gate electrodes of said first N-channel TFT and said second N-channel TFT respectively.

30. An electronic equipment comprising the display device according to claim 29 is selected from the group consisting of a front projector, a rear projector, a head mount display, a computer, a video camera, a DVD player, and a display apparatus.

31. The display device according to claim 29 is a liquid crystal display device.

32. A rear projector using three display devices according to claim 29.

33. A front projector using three display devices according to claim 29.

34. A rear projector using one display device according to claim 29.

35. A front projector using one display device according to claim 21.

36. A display device comprising:

a pixel portion including m×n pixels (in a pixel (h, k), (h=1, 2, 3, . . . , m−1, m) and (k=1, 2, 3, . . . , n−1, n), with m and n both being natural numbers and satisfying the relation m<n), said pixels each having a TFT;

a gate driver having a first N-channel TFT for feeding n gate signal lines with selection signals;

a source driver having a second N-channel TFT for feeding m source signal lines with video data; and a video data converter circuit, wherein said video data converter converts a digital video datum (h, k) into {m×(k−1)+h}-th video datum, wherein said video data converter circuit has a video formatter, a memory and an address generator, and wherein said TFT has a first LDD region not overlapped by a gate electrode of said TFT, and each of said first N-channel TFT and said second N-channel TFT has a second LDD region overlapped by gate electrodes of said first N-channel TFT and said second N-channel TFT respectively.

37. A rear projector using three display devices according to claim 36.

38. A front projector using three display devices according to claim 36.

39. A rear projector using one display device according to claim 36.

40. A front projector using one display device according to claim 36.

41. An electronic equipment comprising the display device according to claim 36 is selected from the group consisting of a head mount display, a computer, a video camera, a DVD player, and a display apparatus.

42. The display device according to claim 36 is a liquid crystal display device.

43. A display device comprising:

a pixel portion including m×n pixels (m and n are both natural numbers and satisfy the relation m<n), said pixels each having a TFT;

a gate driver having a first N-channel TFT for feeding n gate signal lines with selection signals;

two source drivers each having a second N-channel TFT for feeding m source signal lines with video data; and a video data converter circuit, wherein said video data converter converts a digital video datum (h, k) {(h=1, 2, 3, . . . , m−1, m) and (k=1, 2, 3, . . . , n−1, n)} into {m×(k−1)+h}-th video datum, and wherein said TFT has a first LDD region not overlapped by a gate electrode of said TFT, and each of said first N-channel TFT and said second N-channel TFT has a second LDD region overlapped by gate electrodes of said first N-channel TFT and said second N-channel TFT respectively.

44. A rear projector using three display devices according to claim 43.

45. A front projector using three display devices according to claim 43.

46. A rear projector using one display device according to claim 43.

47. A front projector using one display device according to claim 43.

48. An electronic equipment comprising the display device according to claim 43 is selected from the group consisting of a head mount display, a computer, a video camera, a DVD player, and a display apparatus.

49. The display device according to claim 43 is a liquid crystal display device.

* * * * *